United States Patent [19]

Hasebe et al.

[11] Patent Number: 5,658,615
[45] Date of Patent: Aug. 19, 1997

[54] METHOD OF FORMING COATING FILM AND APPARATUS THEREFOR

[75] Inventors: Keizo Hasebe, Kofu; Akihiro Fujimoto, Kumamoto-ken; Hiroichi Inada, Kumamoto; Hiroyuki Iino, Nirasaki; Shinzi Kitamura, Kumamoto-ken; Masatoshi Deguchi, Kumamoto; Mitsuhiro Nambu, Kumamoto-ken, all of Japan

[73] Assignees: Tokyo Electron Limited, Tokyo; Tokyo Electron Kyushu Limited, Tosu, both of Japan

[21] Appl. No.: 217,636

[22] Filed: Mar. 25, 1994

[30] Foreign Application Priority Data

| Mar. 25, 1993 | [JP] | Japan | 5-092579 |
| May 10, 1993 | [JP] | Japan | 5-132594 |
| Jun. 30, 1993 | [JP] | Japan | 5-183442 |
| Jun. 30, 1993 | [JP] | Japan | 5-183443 |
| Dec. 16, 1993 | [JP] | Japan | 5-343717 |
| Dec. 16, 1993 | [JP] | Japan | 5-343722 |
| Dec. 24, 1993 | [JP] | Japan | 5-347348 |
| Dec. 27, 1993 | [JP] | Japan | 5-348812 |
| Dec. 28, 1993 | [JP] | Japan | 5-354052 |
| Dec. 28, 1993 | [JP] | Japan | 5-354054 |

[51] Int. Cl.$^6$ ........................................ B05D 3/12
[52] U.S. Cl. .................. 427/240; 427/299; 427/385.5; 438/782
[58] Field of Search ................... 423/240, 299, 423/385.5; 437/231

[56] References Cited

U.S. PATENT DOCUMENTS

| 4,267,212 | 5/1981 | Sakawaki. |
| 4,451,507 | 5/1984 | Beltz et al. |
| 5,002,008 | 3/1991 | Ushijima et al. |
| 5,066,616 | 11/1991 | Gordon | 427/240 |
| 5,366,757 | 11/1994 | Lin | 427/240 |
| 5,366,759 | 11/1994 | Beckerle | 427/240 |

FOREIGN PATENT DOCUMENTS

| 0 403 086 A3 | 12/1990 | European Pat. Off. . |
| 49 114402 | 10/1974 | Japan . |
| 50 85638 | 7/1975 | Japan . |
| 57 43422 | 3/1982 | Japan . |
| 59 11895 | 3/1984 | Japan . |
| 59 141220 | 8/1984 | Japan . |
| 61 91655 | 5/1986 | Japan . |
| 61 150332 | 7/1986 | Japan . |
| 61 280618 | 12/1986 | Japan . |
| 62 126640 | 6/1987 | Japan . |

OTHER PUBLICATIONS

Database WPI, Section Ch, Week 8625, Derwent Publications Ltd., London, GB; Class G06, AN 86–158886 & JP–A–61 091 655 (Matsushita Eltrn. Corp.), 9 May 1986 *Abstracts)*.

Patent Abstracts of Japan, vol. 10 No. 347, (E–457), 21 Nov. 1986 & JP–A–61 150332 (Toshiba Corp.) 9 Jul 1986, *Abstract*.

*Primary Examiner*—Janyce Bell
*Attorney, Agent, or Firm*—Oblon, Spivak, McClelland, Maier & Neustadt, P.C.

[57] ABSTRACT

An apparatus for forming a coating film, comprises a spin chuck for supporting a substrate with one surface facing upward and rotating the substrate about a vertical axis, a first nozzle for supplying a solvent of a coating solution on the substrate, and a second nozzle for supplying the coating solution on a central portion of the substrate. The first and second nozzles are supported by a head such that the supported nozzle moves between a dropping position above the substrate and a waiting position offset from the substrate. The solvent and coating solution are diffused along the surface of the substrate by rotating the spin chuck.

23 Claims, 17 Drawing Sheets

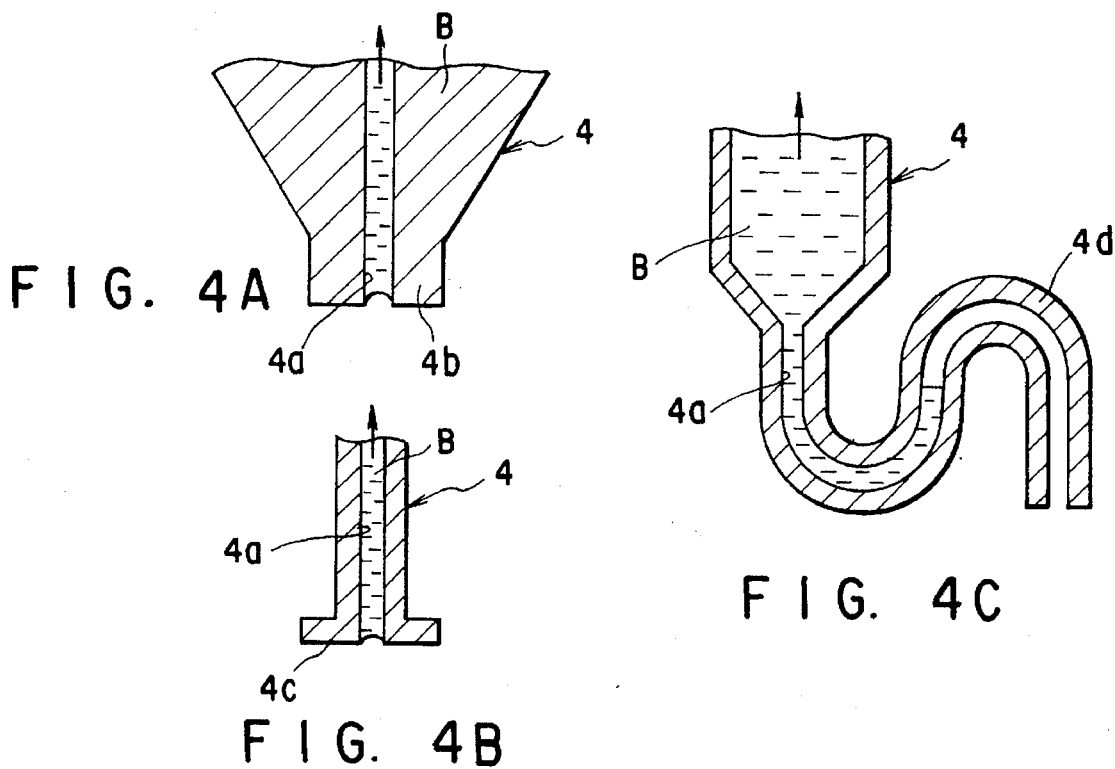
FIG. 4A
FIG. 4B
FIG. 4C
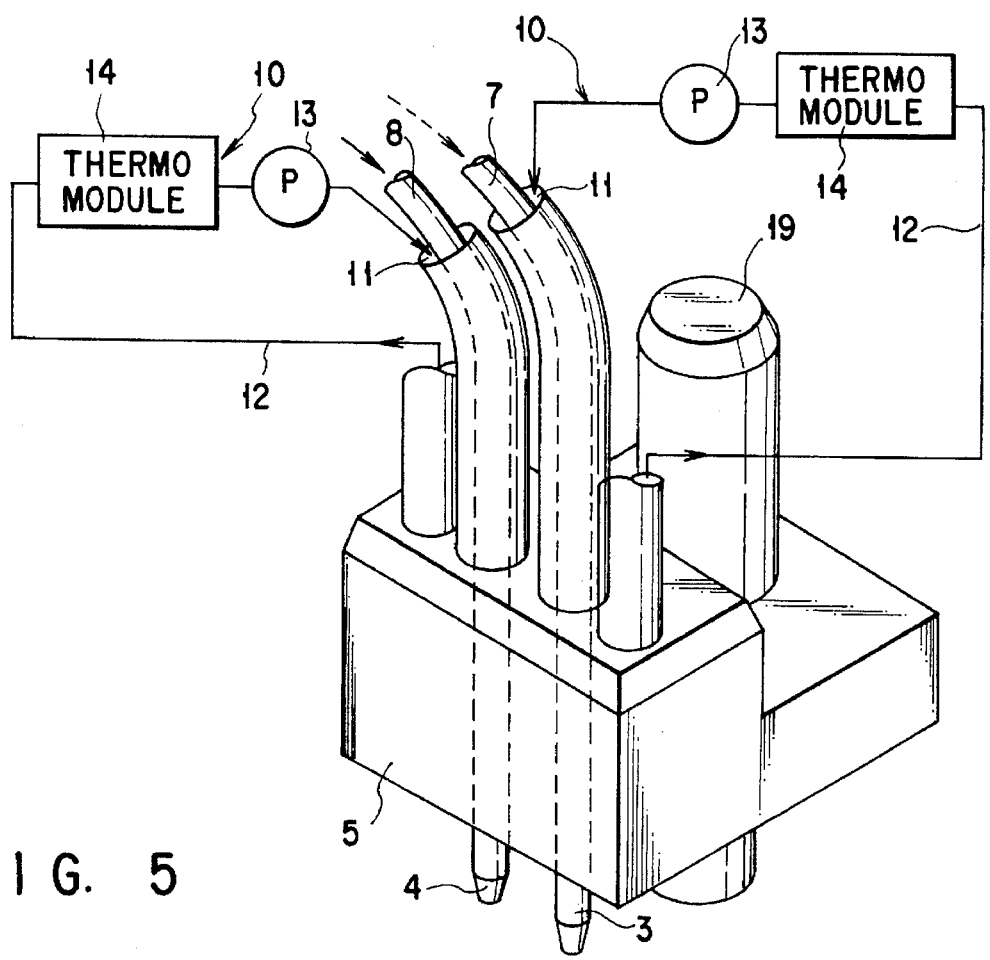
FIG. 5

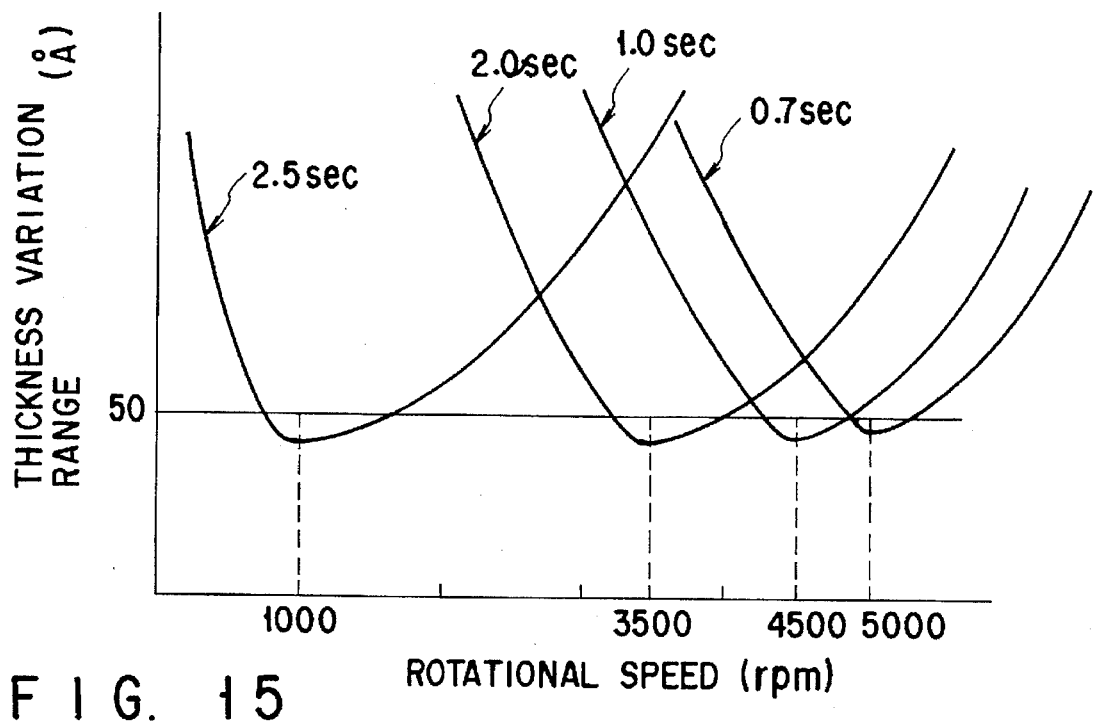
F I G. 15
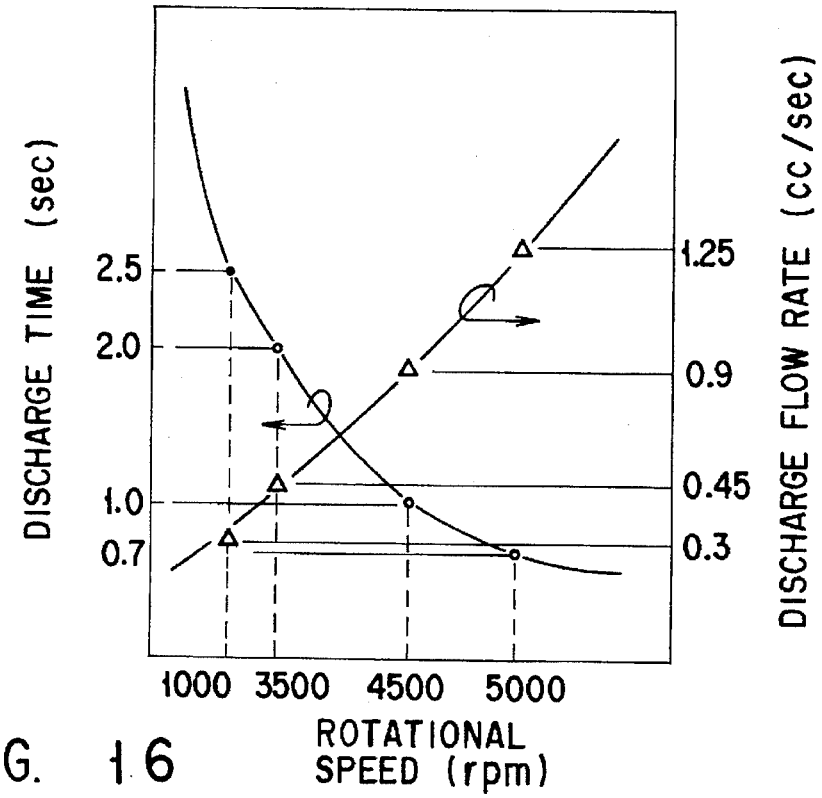
F I G. 16

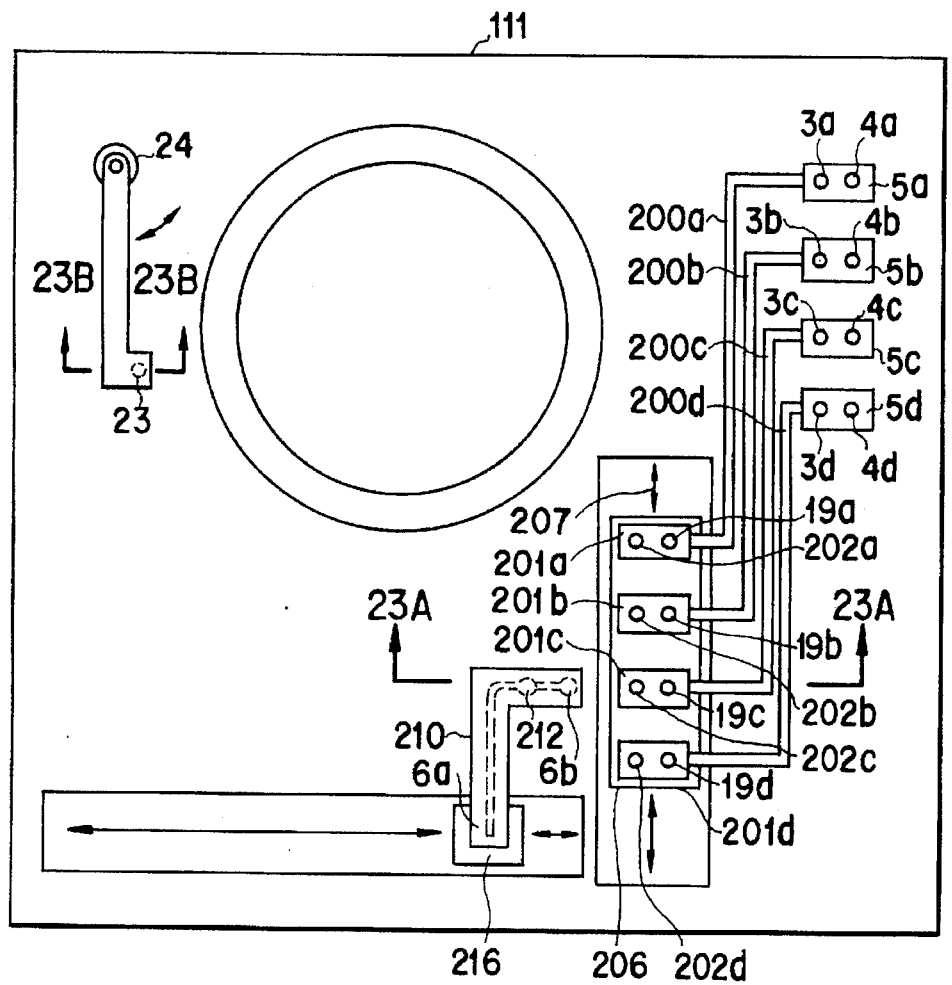
FIG. 23
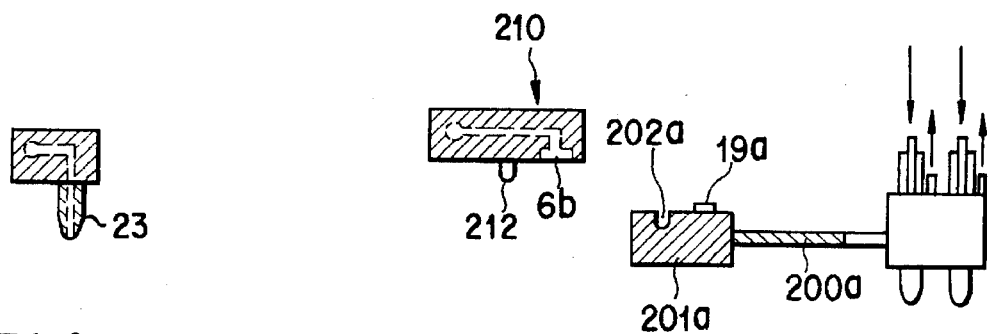
FIG. 23B
FIG. 23A

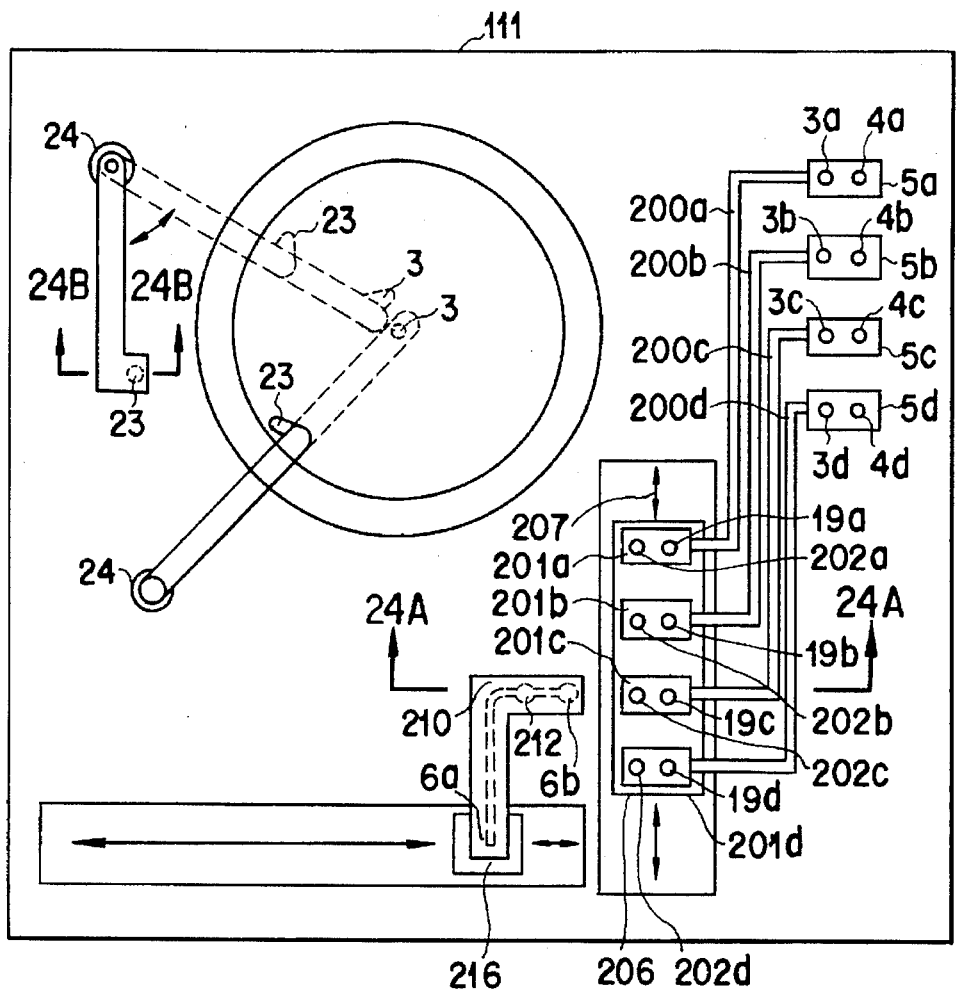
F I G. 24
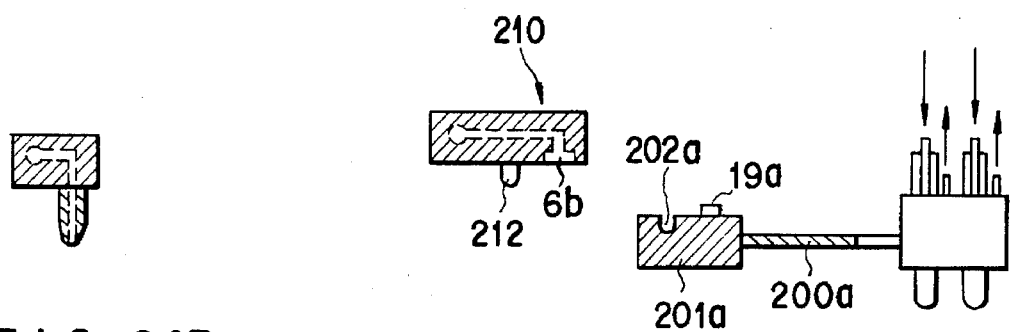
F I G. 24B
F I G. 24A

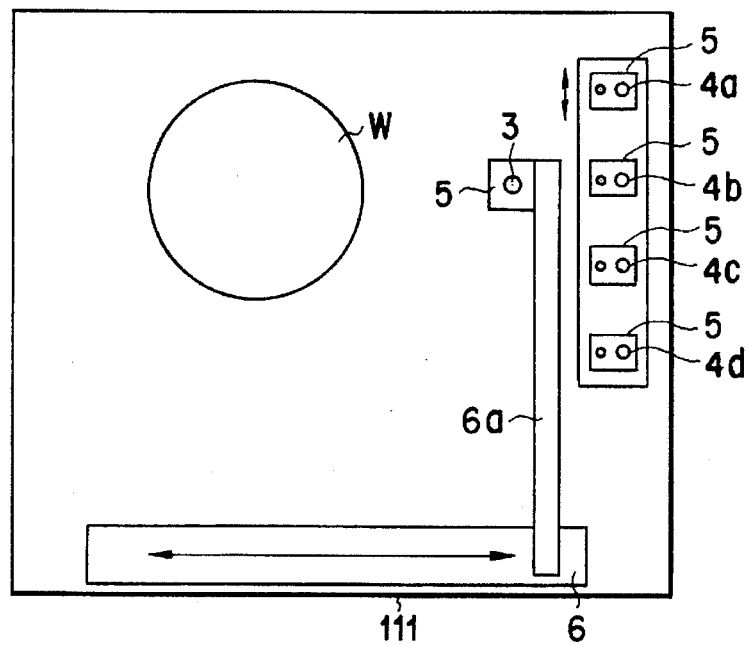
F I G. 25
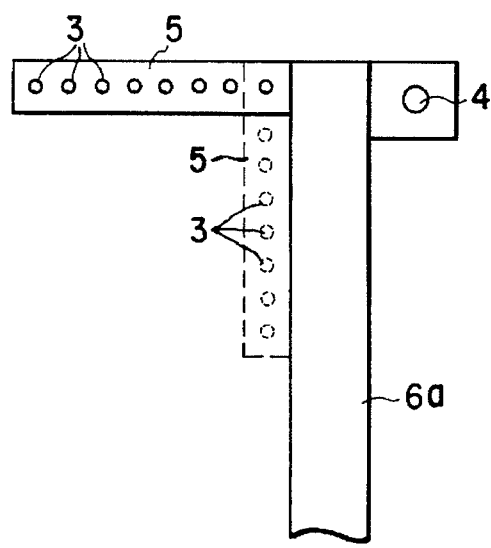
F I G. 26

METHOD OF FORMING COATING FILM AND APPARATUS THEREFOR

Background of the Invention

1. Field of the Invention

The present invention relates a method of forming a coating film such as a resist film on a semiconductor wafer or a layer formed thereon, and an apparatus therefor.

2. Description of the Related Art

As is well known, in the field of semiconductor techniques, a resist film is formed on the surface of a layer as a mask for a pattern portion when a semiconductor layer, an insulating layer, or an electrode layer formed on a semiconductor wafer is to be etched into a predetermined pattern.

For example, spin coating is known as a method of forming a resist film. According to this method, a table is rotated with a semiconductor wafer being placed and fixed thereon. For example, a resist solution consisting of a solvent and a photo-sensitive resin is dropped on the central portion of the upper surface of the wafer. The resist solution is spirally diffused from the central position of the wafer to its peripheral portion in accordance with the rotational and centrifugal forces of the wafer, thereby coating the resist solution on the semiconductor wafer.

According to this method, in the process of diffusing the resist solution from the central position of the wafer to its peripheral portion, the solvent in the resist solution evaporates. For this reason, the viscosity of the resist solution varies in a diffusion direction, and the thickness of the resist film at the central portion is different from that at the peripheral portion. In addition, the peripheral velocity at the peripheral portion is higher than that at the central position, and a scattering amount of the resist solution at the peripheral portion is much larger than that at the central position. Thus, uniform coating can not be obtained.

For this reason, as described in Jpn. Pat. Appln. KOKAI Publication Nos. 57-43422 and 59-141220, there is provided a method of adjusting the temperature of a resist solution or a method of filling the same solvent as in a resist solution in a resist film formation atmosphere to suppress evaporation of the solvent in the resist solution. As described in Jpn. Pat. Appln. KOKAI Publication Nos. 59-11895, 61-91655, and 61-150332, a method of dropping the solvent of a resist solution on a wafer surface prior to resist solution coating is also proposed.

In the former method, however, the amount of resist solution used in forming a resist film is large. For example, only 1 to 2% of the total amount of resist solution contribute to actual formation of the resist film. For example, to form a 1-µm thick resist film, 4 to 8 cc of a resist solution are required for an 8" semiconductor wafer. In the latter method, it is difficult to obtain uniform coating and thus, the conventional problems cannot be satisfactorily solved.

SUMMARY OF THE INVENTION

It is an object of the present invention to provide a method which requires a smaller amount of coating solution such as a resist solution and can form a coating film having a uniform thickness, and an apparatus therefor.

According to an aspect of the present invention, there is provided a method of forming a coating film, comprising the steps of applying a solvent of a coating solution on one surface of a substrate kept rotated or stopped, rotating the substrate applied with the solvent at a first rotational speed to diffuse the solvent through an entire area of one surface, and applying a predetermined amount of coating solution at substantially the center of the substrate while rotating the substrate at a second rotational speed, thereby diffusing the coating solution to the entire area of one surface to form a coating film.

According to the present invention, a substrate (semiconductor wafer, liquid crystal substrate or the like) means a substrate itself and a substrate including layers or a layer of other materials such as a metal layer and semiconductor layer. Therefore, a substrate applied with a solvent indicates a solvent directly applied on the substrate or a solvent applied on such a layer formed on the substrate. That is, it means a substrate on which a coating solution is to be applied. The shape of the substrate is not limited. Thus, it may have a circular disk shape, rectangular shape or the like.

According to the present invention, a coating solution indicates a solution which present in a liquid state by a solvent, as is conventionally used in the common field. For example, it means a resist (photo-sensitive) solution, magnetized solution on the like.

According to the present invention, the size of, for example, a semiconductor wafer serving as a substrate, the rotational speed during coating a coating solution, the inner diameter of a nozzle (second nozzle) for the coating solution, supply time and amount of the coating solution are preferably set as follows. However, the conditions are not limited to these.

6" Wafer

Rotational Speed: 3,000 to 6,000 rpm

Inner Diameter of Nozzle: 0.1 to 2.0 mm

Supply Time

Flat Wafer: 4 ±2 sec

Uneven Wafer: 3 ±2 sec

Supply Amount

Flat Wafer: 0.2 to 1.0 cc

Uneven Wafer: 0.5 to 2.0 cc

8" Wafer

Rotational Speed: 2,000 to 4,000 rpm

Inner Diameter of Nozzle: 0.5 to 2.0 mm

Supply Time

Flat Wafer: 6 ±2 sec

Uneven Wafer: 4 ±2 sec

Supply Amount

Flat Wafer: 0.5 to 2.0 cc

Uneven Wafer: 1.0 to 3.0 cc

12" Wafer

Rotational Speed: 1,000 to 3,000 rpm

Inner Diameter of Nozzle: 0.8 to 3.5 mm

Supply Time

Flat Wafer: 9 ±1 sec

Uneven Wafer: 7 ±1 sec

Supply Amount

Flat Wafer: 1.0 to 3.0 cc

Uneven Wafer: 1.5 to 5.0 cc

LCD Substrate:

Rotational Speed: 500 to 2,000 4 rpm

Inner Diameter of Nozzle: 0.8 to 5.0 mm

Supply Time: 12 ±4 sec

Supply Amount: 2.0 to 9.0 cc

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A, 4B and 4C are sectional views respectively showing the different modifications of a resist solution supply nozzle and its distal portion;

FIG. 5 is an enlarged perspective view showing a spray head used in the coating apparatus;

FIG. 15 is a graph showing a thickness variation range by the relationship between the discharge time of the resist solution and the rotational speed of an 8" semiconductor wafer;

FIG. 16 is a graph showing the relationship between the discharge time and the discharge flow rate of the resist solution, and the rotational speed of the wafer;

Figure 18:
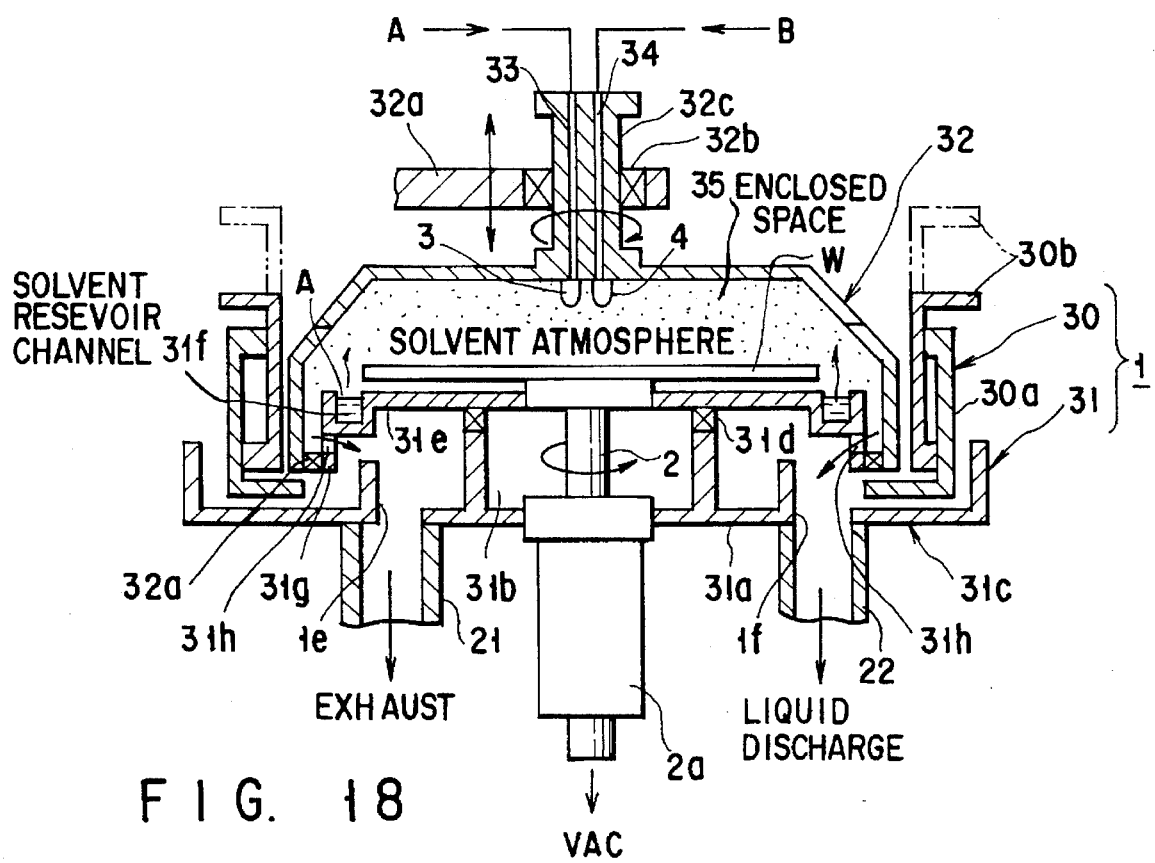
Figure 19:
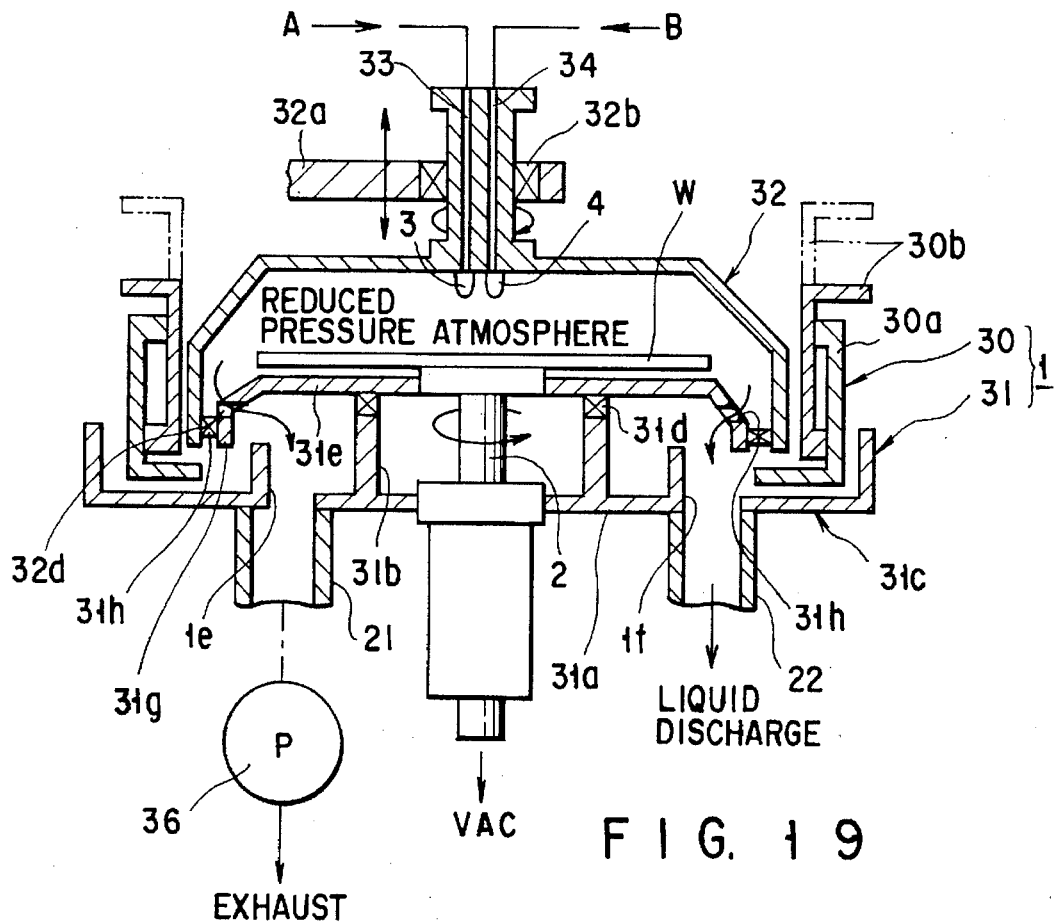
Figure 21:
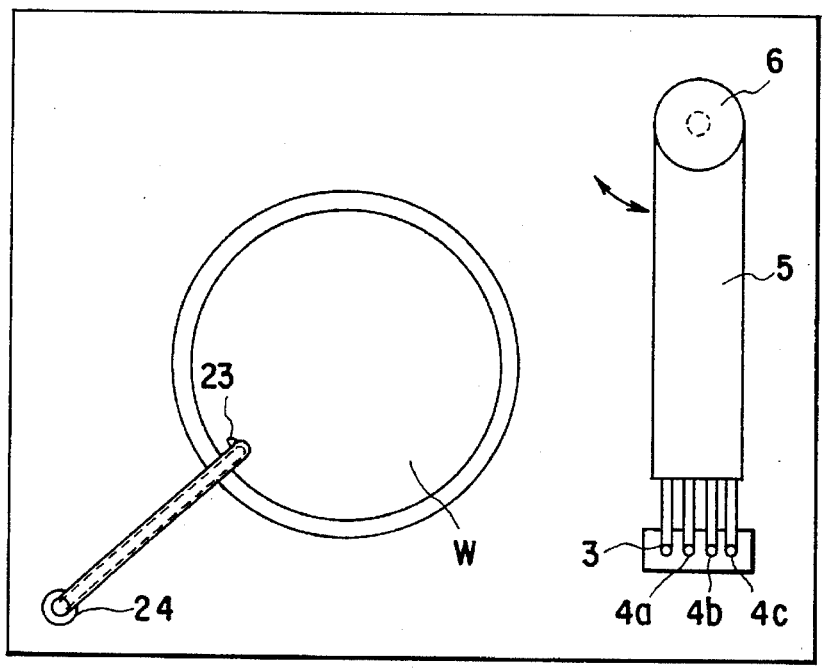
Figure 20:
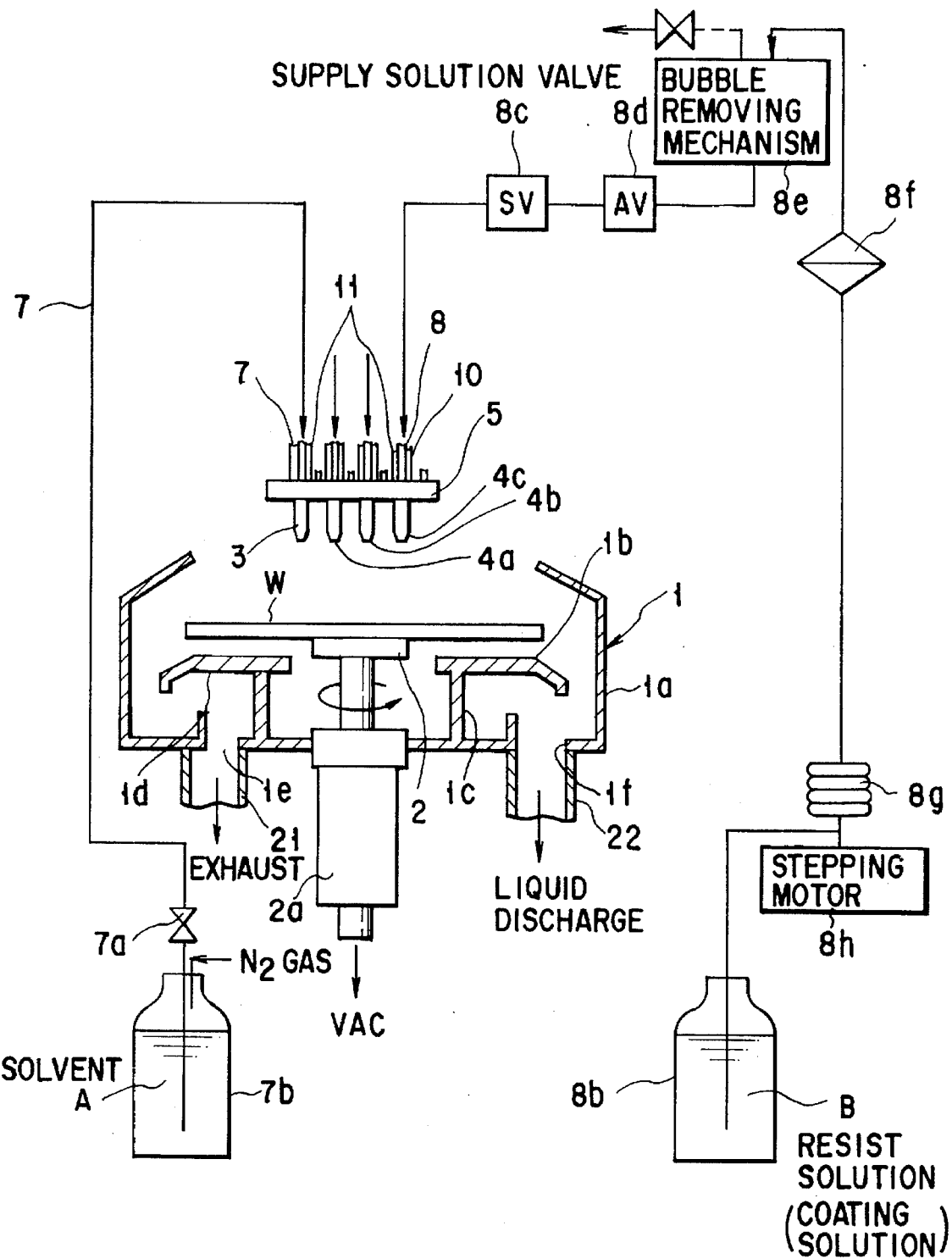
Figure 22:
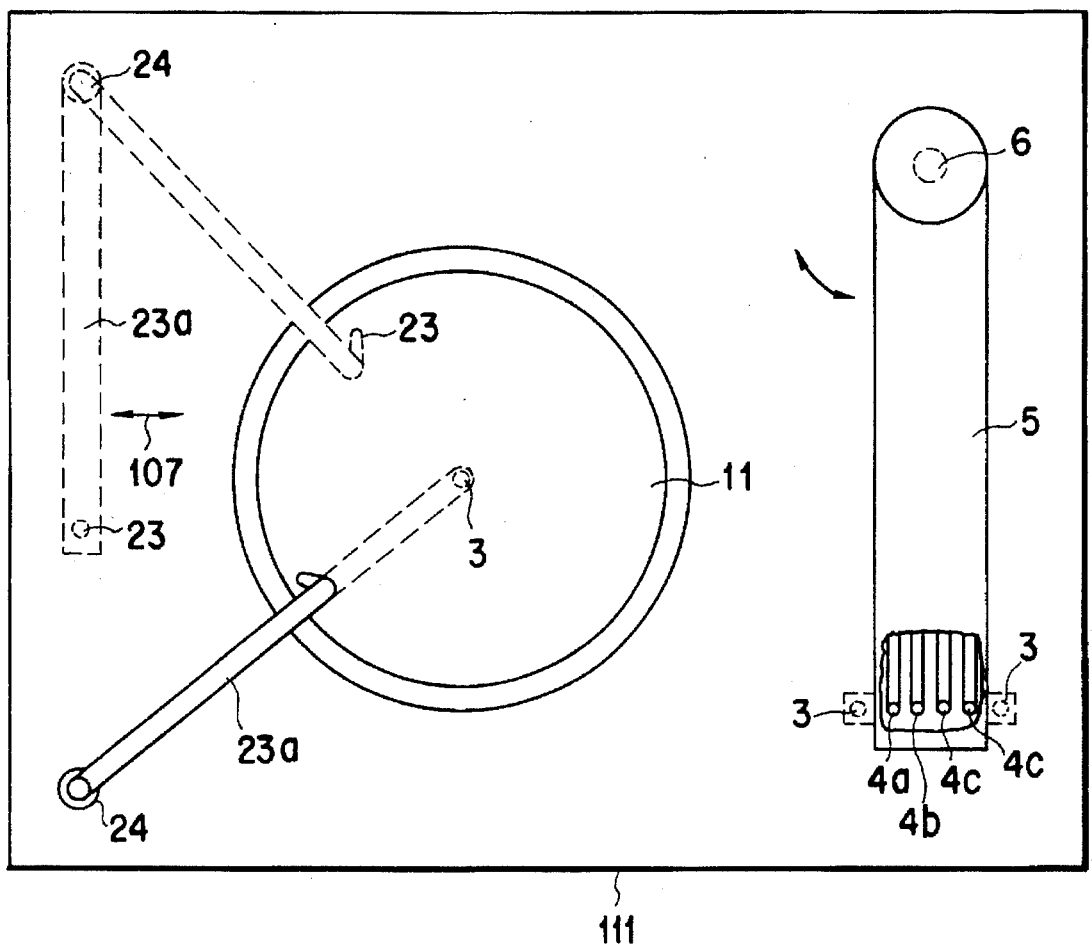

PIG. 17 is a graph showing a thickness variation range by the relationship between the discharge time of the resist solution and the rotational speed of a 6" semiconductor wafer;

FIG. 18 is a schematic sectional view showing an apparatus for forming a resist film in a solvent atmosphere;

FIG. 19 is a schematic sectional view showing an apparatus for forming a resist film in a reduced pressure atmosphere;

FIGS. 20 and 21 are a schematic sectional view and a schematic plan view, respectively, showing a coating apparatus having three resist solution supply nozzles;

FIG. 22 is a schematic plan view for explaining the modification of the apparatus shown in FIG.

FIG. 23 is a schematic plane view for explaining the modification of the apparatus shown in FIG. 22;

FIG. 23A and 23B are cross-sectional views taken along lines 23A–23B and 23B—23B in FIG. 23, respectively;

FIG. 24 is a schematic plane view for explaining the other modification of the apparatus shown in FIG. 22;

FIG. 24A and 24B are cross sectional views taken along lines 24A—24A and 24B—24B in FIG. 24, respectively;

FIG. 25 is a plan view for explaining an apparatus having further different spray heads; and FIG. 26 is a plan view showing the modification of a spray head of the apparatus shown in FIG. 25.

DETAILED DESCRIPTION OF THE PREFERRED EMBODIMENTS

An embodiment of the present invention will be described in detail with reference to the accompanying drawings.

In this description, a method of forming a coating film and a forming apparatus or a coating apparatus according to the present invention will be applied to a method of forming a resist film of a semiconductor wafer and a forming apparatus therefor.

Figure 1:
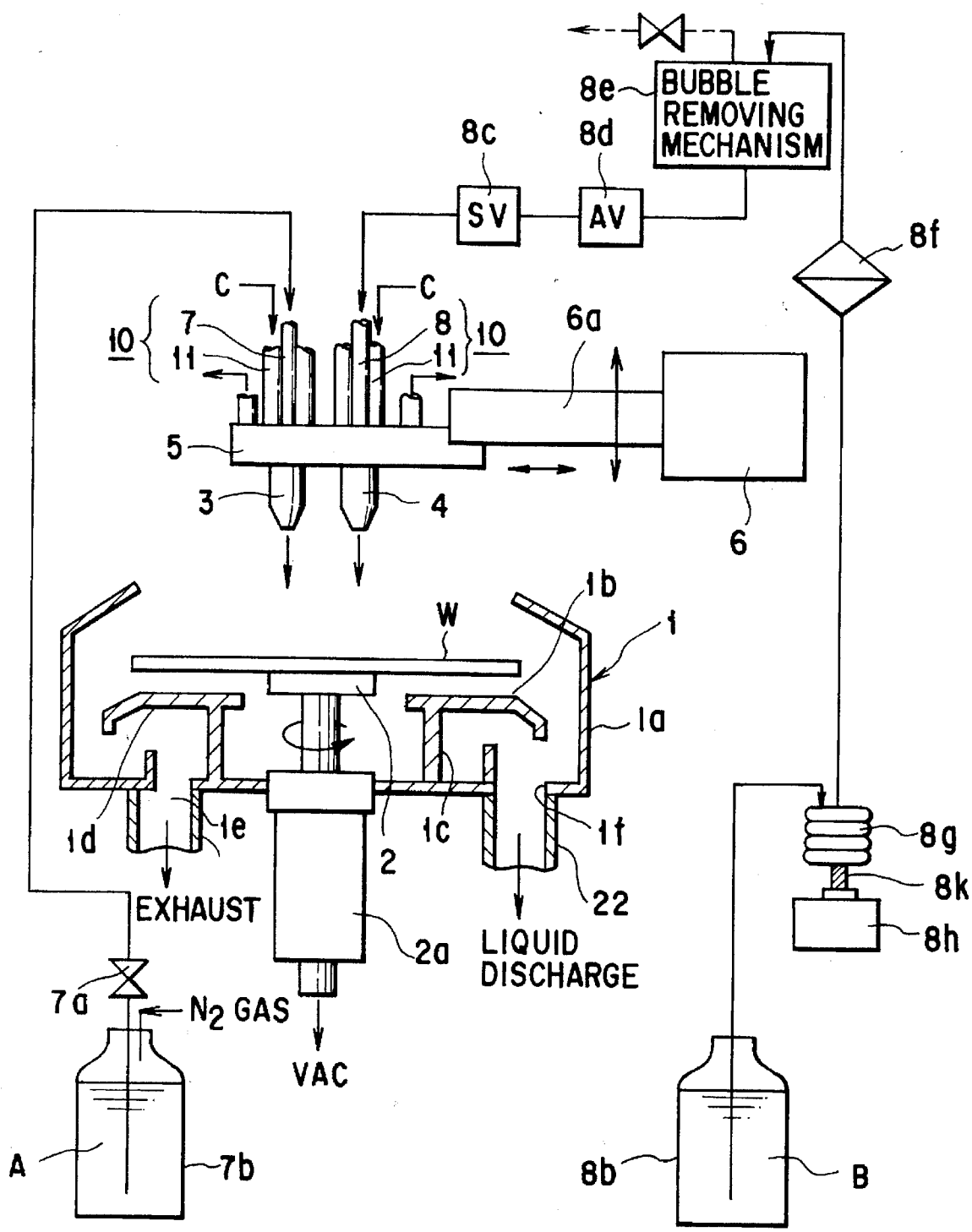
FIG. 1 is a schematic view showing a resist coating apparatus for performing a method of forming a coating film according to an embodiment of the present invention.

As shown in FIG. 1, the coating apparatus comprises a process vessel 1, a rotating member having a vertically movable mechanism, e.g., a spin chuck 2, a motor 2a such as a pulse motor as a means for rotating this spin chuck 2, a spray head 5, and a scanning mechanism 6. The process vessel 1 houses a target to be coated or a disk-like substrate, e.g., a semiconductor wafer W (to be referred to as a wafer hereinafter). The spin chuck 2 holds the wafer W on its upper surface in a horizontal state by vacuum suction, and is rotated at a variable rotational speed according to a preset program. A supply nozzle 3 (first nozzle) of a solvent A of a coating solution and a supply nozzle 4 (second nozzle) of a resist solution B as the coating solution, both of which are movable above the spin chuck 2, are close to each other and integrally mounted on the spray head 5. The scanning mechanism 6 is a means for holding the spray head 5 to move between a spray head waiting position and an operating position above the wafer. A solvent supply path and a resist solution supply path respectively from the nozzles 3 and 4 comprise temperature adjustment mechanisms 10 for setting the solvent A and the resist solution B flowing through these paths to preset temperatures, respectively.

The supply nozzle 3 is connected to a solvent tank 7b through a solvent supply tube 7 as a solvent supply path and an opening/closing valve 7a. A predetermined amount of the solvent A in the solvent tank 7b can be supplied to the wafer W in a predetermined time by controlling the pressure of a nitride ($N_2$) gas supplied to the solvent tank 7b.

The resist solution supply nozzle 4 communicates with a resist solution tank 8b through a resist solution supply tube 8 as a resist solution supply path. A suck back valve 8c, an air-operated valve 8d, a bubble removing mechanism 8e for separating and removing bubbles in the resist solution B, a filter 8f, and a bellows pump 8g are subsequently provided to the tube 8. The bellows pump 8g is controlled by a driving section to be expandable and can supply (for example drop) a predetermined amount of resist solution on the central portion of the wafer w through the nozzle 4. Thus, this mechanism can control a supply amount of the resist solution so that it is less than that in a conventional method. The driving section comprises, e.g., a ball screw assembly 8k constituted by a screw having one end attached to one end of the bellows pump and a nut threadably engaged with this screw, and a stepping motor 8h for linearly moving the screw by rotating the nut. More particularly, the inner diameter of the resist solution supply nozzle 4 is set to 0.1 to 2.0 mm, and preferably 1.0 mm for a 6" wafer, 0.5 to 2.0 mm, and preferably 1.5 mm for an 8" wafer, and 0.8 to 3.5 mm, and preferably 2.0 mm for a 12" wafer. In this manner, although the diameter of the nozzle is preferably set in accordance with the size of the wafer, it can be arbitrarily set within the range of 0.1 to 3.5 mm. In any case, the nozzle can supply the resist solution in a smaller amount for a longer time. When the supply time is short, uniformity of the film thickness is degraded, and when it is long, the resist solution does not reach the peripheral portion of the wafer. Here, the smaller supply amount of resist solution depends on the inner diameter of the nozzle and the pressure for supplying the resist solution.

Figure 3:
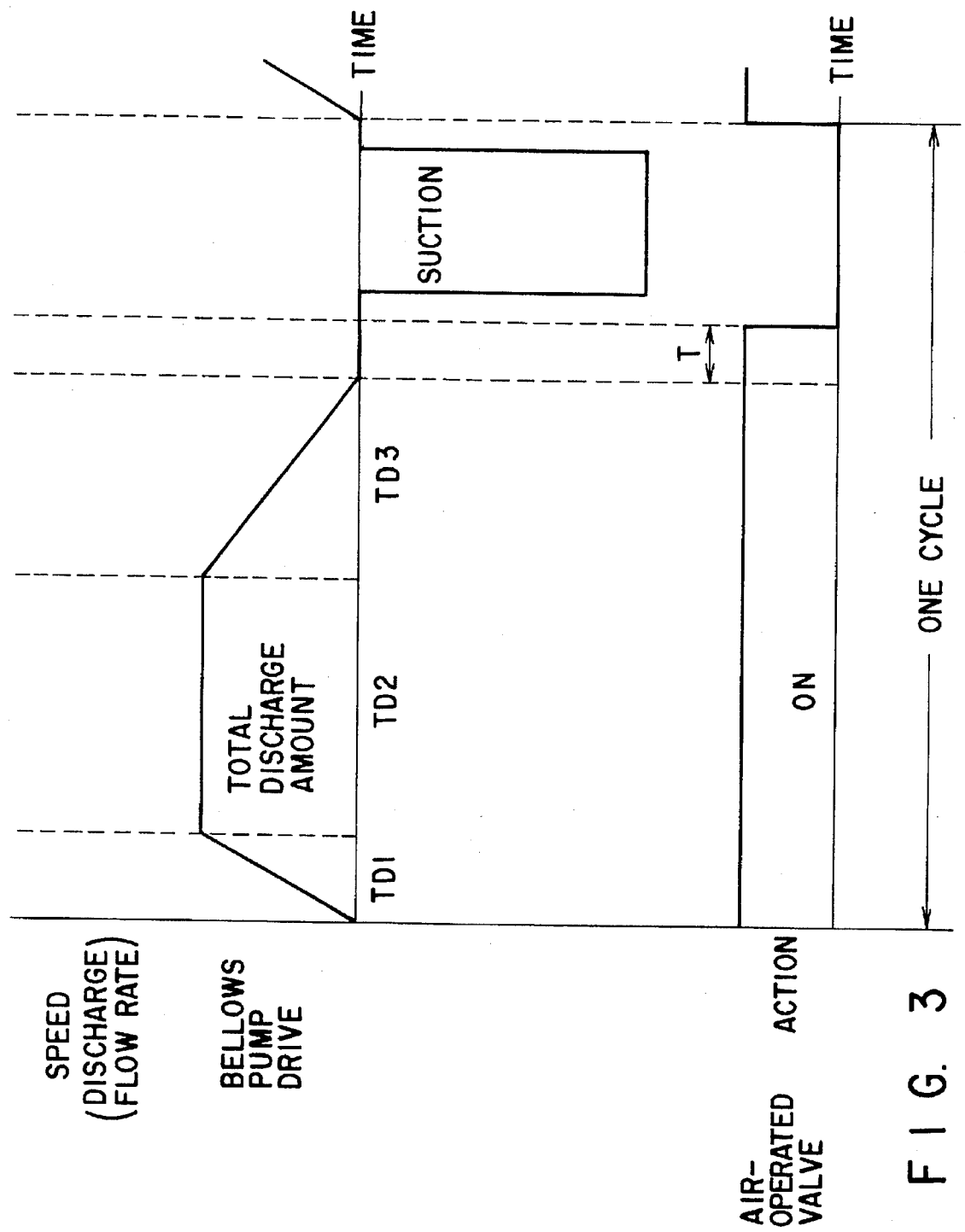
FIG. 3 is a timing chart showing the discharge flow rate (driving time of a bellows pump) of a resist solution from a nozzle and the operation timing of an air-operated valve with a lapse of time.

In the resist solution supply system having the above arrangement, the discharge time of the resist solution is controlled by the drive time of the stepping motor $8h$ for the bellows pump $8g$ (control precision: ±2 msec). The discharge amount of the resist solution is set by the drive operation of the bellows pump $8g$, e.g., a drive time and a drive speed, and the opening/closing operation (ON-OFF operation) of the air-operated valve $8d$ for opening/closing the resist solution supply path. For example, as shown in FIG. 3, the discharge steps of the bellows pump $8g$ are divided into a drive rise time (initial period after starting discharge) TD1 when a flow rate gradually increases, a drive time (intermediate period after discharge) TD2 when the flow rate is kept constant, and a drive fall time (last period before finish) TD3 when the flow rate gradually decreases, according to film forming conditions. The discharge (supply) amount of the resist solution, and also the discharge (supply) time can be accurately controlled by controlling these steps singly or in a combination. The abscissa of FIG. 3 indicates a time (sec), and the ordinate indicates the discharge flow rate (this is proportional to the driving time of the bellows pump) of the resist solution from the nozzle 4 and the operation timing of the air-operated valve.

In addition, since the contraction operation of the bellows pump $8g$ can be changed by controlling and changing only the rotational speed of the stepping motor $8h$, the discharge flow rate can be controlled during the TD1, TD2, and TD3 periods. For example, the discharge flow rate is automatically controlled such that the discharge flow rate is gradually increased by gradually increasing the rotational speed of the stepping motor $8h$ during the TD1 period, is kept constant by keeping the rotational speed constant during the TD2 period, and is gradually decreased by gradually decreasing the rotational speed during the TD3 period.

As shown in FIG. 3, the air-operated valve $8d$ is turned on in accordance with the discharge steps of the bellows pump $8g$, and kept on during a predetermined time T (e.g., 0.1 to 1.2 seconds) after the end of the discharge steps of the bellows pump $8g$. That is, the bellows pump $8g$ is turned off with a delay time to perform a delay operation, so that a pressure acting on the resist solution through piping from the bellows pump $8g$ to the supply nozzle 4 is reduced to be 0, thereby performing the OFF operation. Therefore, instability of the discharge of the resist solution in a step next to the OFF operation can be eliminated, and the resist solution B can be accurately discharged every time. The setting of the drive times (TD1, TD2, and TD3) of the bellows pump $8g$, and the ON-OFF operation of the air-operated valve $8d$ are automatically controlled by the operation of a computer on the basis of a preset program.

The importance in the setting of the drive times (TD1, TD2, and TD3) of the bellows pump $8g$ will be described as follow. After the discharge flow rate of the resist solution is set so that a predetermined amount of a predetermined total discharge amount (TD2) is discharged, the residual amount to be discharged is supplied at a lower flow rate (TD3). In other words, during the TD3 period, the discharge flow amount is gradually decreased and supplied with a elapse of time. Therefore, the problem that the thickness of the resist film becomes thinner at the peripheral portion of the processing target can be solved.

Alternately, the discharge time of the resist solution may be controlled by the opening/closing operation of a variable orifice (not shown) provided to the resist solution supply nozzle 4. In addition, the resist solution B may be supplied not using the bellows pump $8g$, but pressurizing $N_2$ gas to the resist solution tank $8b$. In this case, the discharge time of the resist solution B can be controlled by adjustment of the pressurization amount of $N_2$ gas.

According to the system of this embodiment, since the consumption amount of the resist solution can be reduced, contamination inside the processing vessel is decreased so as to efficiently clean a cup, reduce particles in the cup, and reduce mist attaching the target to be coated. Furthermore, according to an experiment conducted by the present inventor, it was confirmed that the consumption amount of the resist solution was decreased to, for example, about ¼ per day.

Although the setting of the drive times (TD1, TD2, and TD3) of the bellows pump, and the setting of the ON-OFF operation of the air-operated valve are automatically controlled by the operation of a computer on the basis of a preset program, the respective settings can be independently arbitrarily corrected and changed. In addition, only the TD2 is arbitrarily corrected and changed, and a sequencer can be newly added.

After the resist solution is discharged from the supply nozzle 4, the suck back valve $8c$ provided to the resist solution supply system draws, in the supply nozzle 4, the resist solution B remaining by surface tension on the inner wall of the distal end portion of the resist solution supply nozzle 4. Therefore, solidification of the residual resist solution can be prevented. In the resist solution supply nozzle 4 which discharges a small amount of the resist solution B, when the resist solution is normally drawn in the resist solution supply nozzle 4 by the operation of the negative pressure of the suck back valve $8c$, air around the distal end of the nozzle 4 also is drawn in the nozzle 4, a residue of the resist solution B attached to the distal end of the nozzle 4 enters the nozzle 4, thereby causing clogging of the nozzle 4. In addition, the wafer W is contaminated by generation of particles which are formed by dried resist, and the yield may be decreased.

In order to solve the above problem, as shown in FIG. 4A, the thickness of a portion $4b$ near the opening is made larger as compared to a diameter of a nozzle hole $4a$ of the resist solution supply nozzle 4. That is, the nozzle 4 comprises a cylindrical distal end portion $4b$ and an inverted conical trapezoidal portion following to this cylindrical distal end portion. Instead, as shown in FIG. 4B, an outer flange $4c$ is provided to the cylindrical distal end portion or the opening of the resist solution supply nozzle 4 so as to prevent air drawing around the distal end of the nozzle 4 upon suck-back. In addition, as shown in FIG. 4C, a small-diameter bent portion $4d$ extending in a lateral S-shape is formed at the distal end of the vertically extending cylindrical portion of the resist solution supply nozzle 4. The suck-back is performed near the center of the bent portion $4d$, thereby preventing air drawing around the distal end portion of the nozzle.

As shown in FIG. 5, the temperature adjustment mechanisms 10 comprise temperature adjustment solution supply paths 11 provided to surround the respective outer circumferences of the solvent supply tube 7 and the resist solution supply tube 8, circulating paths 12 each having two ends connected to the two ends of the corresponding temperature adjustment solution supply path 11, a circulating pump 13 provided to each circulating path 12, and thermo modules 14, each connected to the course of the circulating path 12, for keeping a temperature adjustment solution C (e.g., constant-temperature pure water) at a constant temperature. The solvent A flowing through the solvent supply tube 7 and the resist solution B flowing through the resist solution supply tube 8 can be kept at a constant temperature (e.g., about 23° C.) by the temperature adjustment mechanisms 10 having the above arrangement.

In FIG. 5, the solvent supply nozzle 3 and the solvent supply tube 7, and the resist solution supply nozzle 4 and the resist solution supply tube 8 are integrally formed, respectively. As will be described below with reference to FIG. 6, however, they are preferably separately formed.

Figure 6:
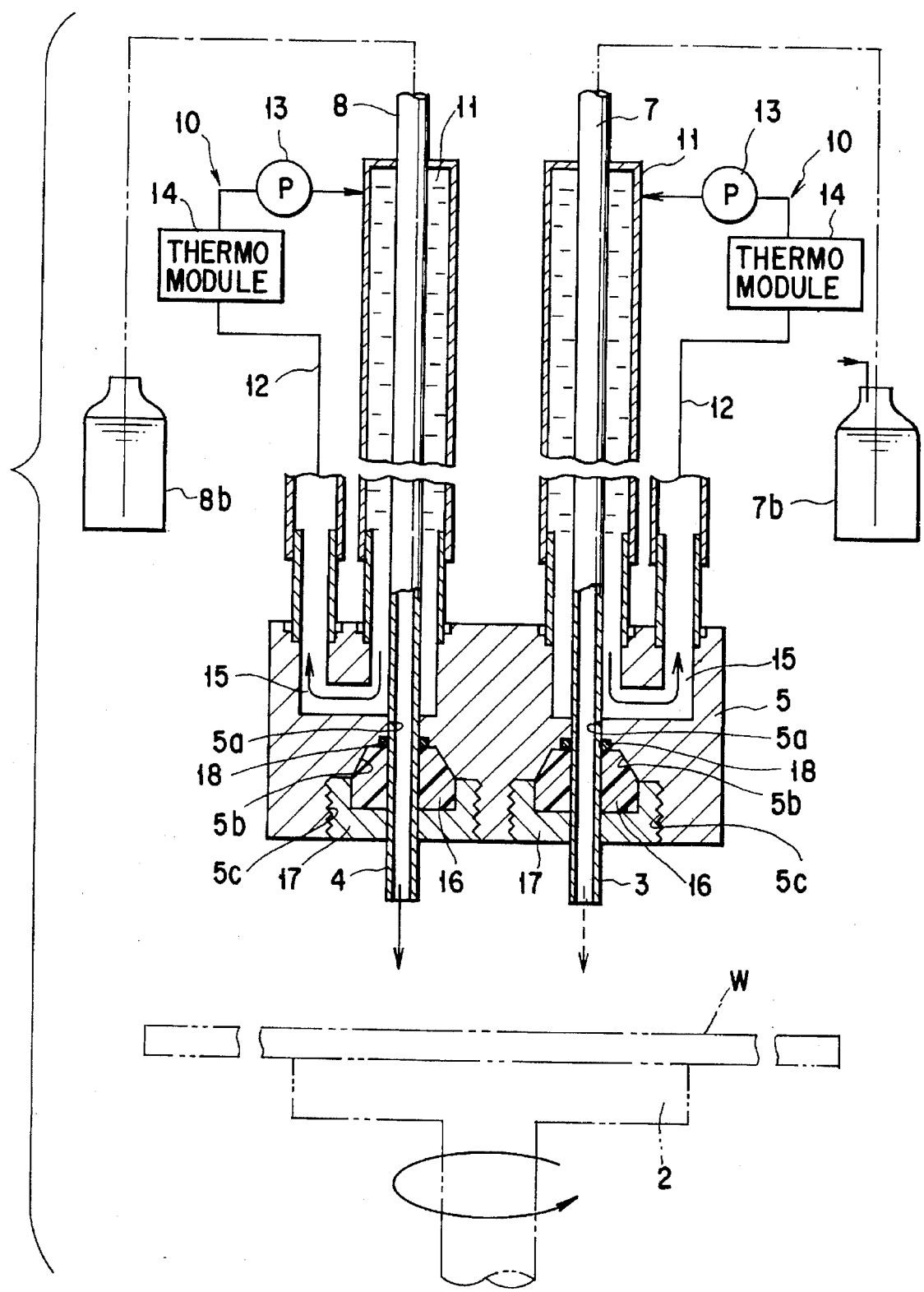
FIG. 6 is a sectional view of the spray head.

The spray head 5 is constituted by a stainless steel or aluminum alloy member. U-shaped holes which respectively constitute the parts of contour paths 15 are formed in the upper portion of the spray head 5. Each vertical through hole 5a extending through the lower surface of the spray head 5 is formed on the bottom portion of each hole. Each through hole 5a comprises an inclined middle portion 5b whose diameter becomes larger downward, and a lower large-diameter portion 5c. An internal thread is formed in the inner circumferential surface of this lower portion. When the nozzles 3 and 4 are mounted on the spray head 5 having the above arrangement, the cylindrical nozzles 3 and 4 are inserted through the through holes 5a to extend the upper and lower portions of the respective nozzles 3 and 4, substantially conical seal members 16 made of a synthetic resin and having vertical through holes through which the nozzles 3 and 4 can extend are packed in the inclined middle portions 5b, and thread members 17 having vertical through holes through which the nozzles 3 and 4 can extend are threaded in the thread-mounted lower portions 5c, thereby pressing the seal members 16 against the inclined inner circumferential surfaces of the middle portions 5b. In this manner, the nozzles 3 and 4 are liquid-tightly mounted on the spray head 5. As shown in FIG. 6, an O-ring 18 is interposed between the upper surface of each middle portion 5b and the upper portion of each seal member 16, so that water-tightness between the contour path 15 and the respective nozzles 3 and 4 can be assured.

A holding pin 19 extends on the upper surface of the spray head 5 at one side. When a scanning arm 6a holding the holding pin 19 is moved by the scanning mechanism 6 in X and Y (horizontal), and Z (vertical) directions, the spray head 5, i.e., the solvent supply nozzle 3 and the resist solution supply nozzle 4 are selectively moved between an operation position above the central portion of the wafer W and a waiting position above a nozzle waiting portion 20. In this case, four kinds of the spray heads 5 (FIG. 2) are disposed in accordance with kinds of the resist solutions. That is, the four spray heads 5 are prepared at the nozzle waiting portion 20, and the resist solution supply nozzles 4 of these spray heads 5 communicate with tanks in which different resist solutions are contained, respectively. In this case, only the resist solution supply nozzle 4 is provided to each spray head 5, and the solvent supply nozzle 3 may be mounted on the distal end of the scanning arm 6a in advance to be commonly used for all the spray heads 5. Furthermore, a plurality of solvent supply nozzles 3 are linearly disposed, and the solvents are supplied from a plurality of portions along the radial direction of the wafer. In this case, different outlet diameters of nozzles are provided to cope with different discharge flow rates and changed according to discharge flow rate, thereby arbitrarily controlling discharge from the respective nozzles.

As shown in FIG. 1, the process vessel 1 comprises a cylindrical outer vessel 1a surrounding the wafer W held by the spin chuck 2, and an annular inner vessel 1d positioned near the lower surface of the wafer W and having a horizontal piece 1b and a cylindrical wall 1c. An exhaust port 1e and a liquid discharge port if are provided to the bottom portion of the outer vessel 1a. An exhaust pipe 21 connected to a suction means, e.g., a vacuum pump (not shown), is connected to the exhaust port 1e, and a liquid discharge pipe 22 is connected to the liquid discharge port 1f.

Figure 2:
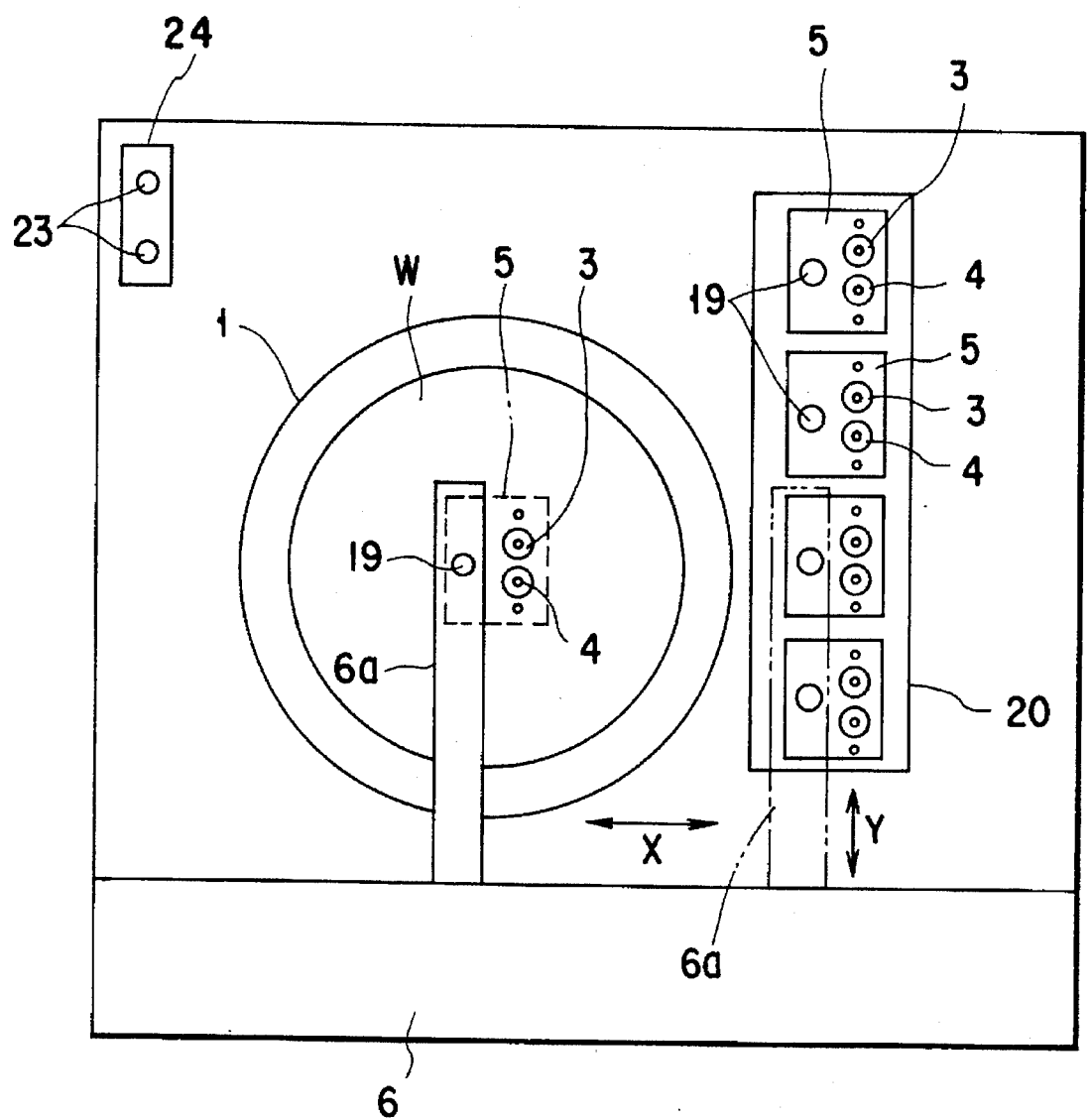
FIG. 2 is a plan view of the coating apparatus.

As shown in FIG. 2, a rinse solution supply nozzle 23 is provided to a side opposing to the nozzle waiting position with respect to the spin chuck 2. The rinse solution supply nozzle 23 is also provided to one end portion of a moving mechanism 24 for vertically moving and pivoting the rinse solution supply nozzle 23. The moving mechanism 24 retreats from the process vessel 1 during not supplying a rinse solution, and pivots and moves downward the rinse solution supply nozzle 23 waiting above to supply the rinse solution to the peripheral portion of the wafer W.

Figure 7:
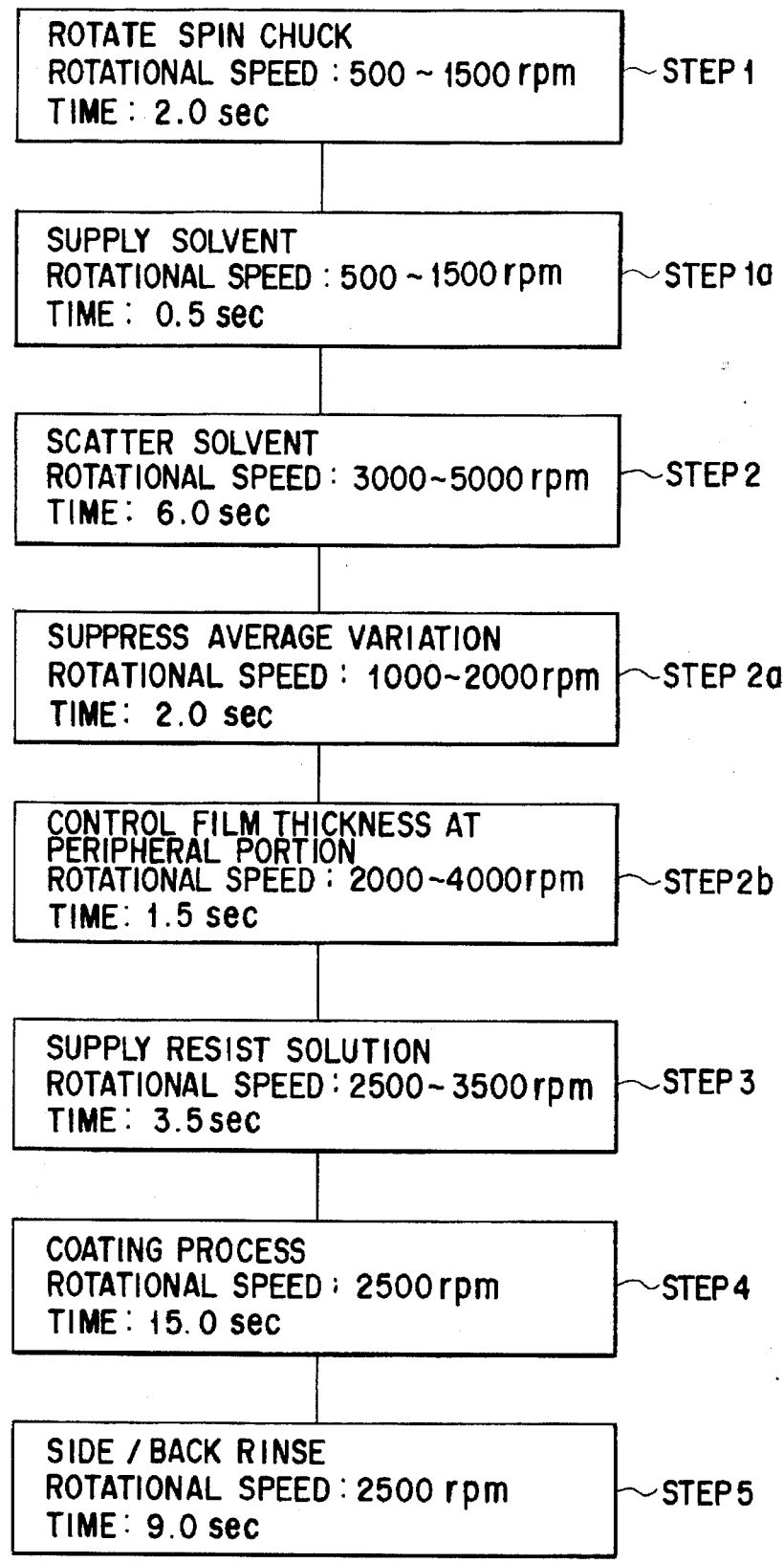
FIG. 7 is a flow chart for explaining a method of forming a resist film using the coating apparatus.

The procedure of forming a resist film by the coating apparatus having the above arrangement will be described with reference to a flow chart of FIG. 7, using an 8" wafer.

A centering structure is provided to a wafer supporting arm (not shown). By this means, one wafer W which is unloaded and positioned from a wafer carrier is moved on the stationary spin chuck 2 by a convey arm (not shown), and held and supported by the spin chuck 2 by vacuum suction (preliminary positioning). In this stationary state, the wafer W is in a still state (0 rmp) without rotation, or is rotated at lower speed (range between about 500 to 1,500 rpm, e.g., rotational speed: 1,000 rpm) than normal rotational speed (range between about 1,500 to 3,500 rpm, e.g., rotational speed: 2,500 rpm) during processing for about 1 to 3 sec, e.g., 2.0 sec (step 1). During or before this rotation, 1.0 cc of methyl-3-methoxypropionate (MMP) as the solvent A of the coating solution is supplied (dropped) on the center of the wafer surface within, e.g., 0.5 sec from the solvent supply nozzle 3 of the spray head 5 clamped by the scanning arm 6a to be moved above the central portion of the wafer W by the scanning mechanism 6 (step 1a).

Then, the solvent A is diffused along the entire surface of the wafer W and scattered from the wafer by rotating the spin chuck 2 for about 2 to 10 sec, e.g., 6.0 sec, at high speed (rotational speed: range between about 3,000 to 5,000 rpm, e.g., 4,000 rpm) (step 2). During 6.0 sec, in order to suppress an average variation between different wafers W (variation in average film thickness), the spin chuck 2 is rotated for about 1 to 5 sec, e.g., 2.0 sec, at low speed (rotational speed: range between about 1,000 to 2,000 rpm, e.g., 1,500 rpm) (step 2a). Thereafter, the spin chuck 2 is preferably rotated at a higher speed (range between about 2,000 to 4,000 rpm, e.g., rotational speed: 2,900 rpm) than normal rotational speed (2,500 rpm) upon processing to control the film thickness of the peripheral portion of the wafer W (step 2b).

The rotational speed of the wafer W is reduced to 1,500 rpm. This is because it is assured by an experiment that unevenness of the resist films occurs among the coated wafers W when rotational speed is not reduced, and this unevenness is to be prevented. The rotational speed of the wafer W is equal to the rotational speed (rotational speed:

2,900 rpm) during resist supply (to be described below) after the step of suppressing the average variation. This is because it is assured by an experiment that this rotational speed is effective to stabilize the thickness of the resist film, and the effective stabilization is to be enhanced.

When the 6.0 sec have elapsed in the step 2, and a solvent film is formed on the surface of the wafer (before the solvent A is dried), the wafer W is rotated at the rotational speed in the range between about 2,500 and 3,500 rpm, e.g., 2,900 rpm, and 1.5 cc of the coating solution, e.g., the resist solution B are supplied (dropped) from the resist solution supply nozzle 4 on the central portion of the solvent film on the wafer surface within 3.5 sec (step 3). The time when the solvent A is dried can be obtained by an experiment in advance. For example, while interference fringes are visually checked on the surface of the wafer W, the surface of the wafer W is not dried, and if the interference fringes are not seen, the surface is dried, thereby knowing the end of drying. In this case, the supply time for 3.5 sec is the drive time of the bellows pump 8g, i.e., is divided into the drive rise time TD1, the normal drive time TD2, and the drive fall time TD3. By this arrangement, the respective times (number of cycle steps) can be independently controlled, and the supply amount of the resist solution can be accurately minutely controlled. The rotational speed of the wafer in step 3 need not be set higher than that in step 2, but also may be set equal to or lower than that in step 2. At this time, the supply speed of the resist solution and the rotational speed of the wafer are preferably set in consideration of drying speed of the solvent. The above conditions are set to match diffusion speed of the resist solution on the wafer with the drying speed of the solvent, so that the resist film having a uniform thickness can be formed in a small amount of resist solution.

At the end of step 3, the resist supply nozzle 4 is returned to the waiting position, and the rotational speed of the wafer W is reduced to 2,500 rpm (normal rotation) to rotate it for 15 sec (step 4). After coating process is finished in this manner, the solvent supply nozzle 23 is moved above the peripheral edge portion of the wafer W, and a solvent for resist is supplied for, e.g., 9.0 sec to dissolve and remove a residual resist solution on the peripheral portion of the wafer W, while the rotational speed of the wafer W is kept at 2,500 rpm. In addition, the solvent for resist is sprayed from a back cleaning nozzle (not shown) to the lower surface of the wafer W to remove the resist solution attached to the lower surface of the wafer W (step 5), thereby finishing the coating operation.

The coating apparatus having the above arrangement according to the present invention is singly used as a resist coating apparatus of the semiconductor wafer W, and can be incorporated for use in a resist coating/developing apparatus of the semiconductor wafer W (to be described below). The structure of the resist coating/developing apparatus in which the coating apparatus of the above embodiment is incorporated will be described below.

Figure 8:
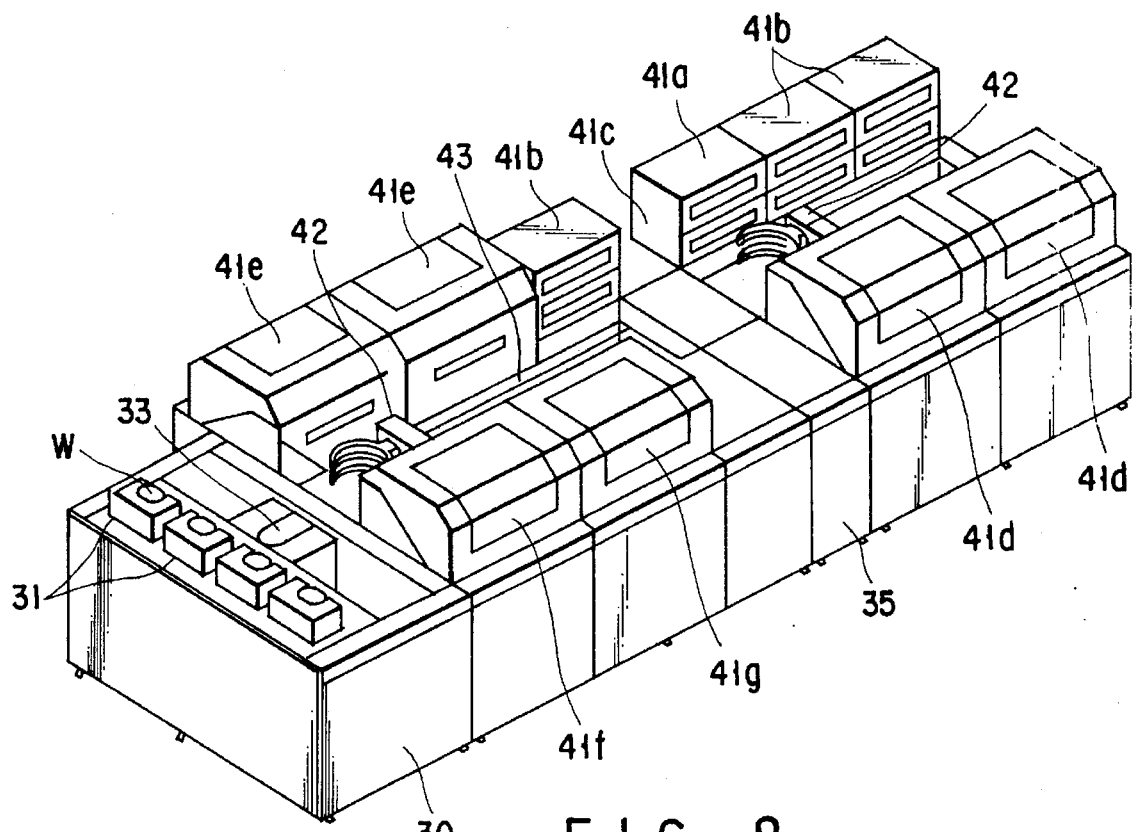
FIG. 8 is a schematic perspective view showing an entire resist coating/developing apparatus to which the coating apparatus is applied.

As shown in FIG. 8, a resist coating/developing apparatus 40 comprises a carrier station 30 at one end. A plurality (e.g., four) of cassettes 31 for containing, e.g., a large number of semiconductor wafers W as a processing target can be mounted in the carrier station 30. An auxiliary arm 33 for loading/unloading and positioning the semiconductor wafer W is provided on the central portion of the carrier station 30. Main arms 42 are provided to be movable at the central portion of the resist coating/developing apparatus 40 in the longitudinal direction and to receive the semiconductor wafer W from the auxiliary arm 33. The various types of process mechanisms are disposed on the two sides of transfer paths of the main arms 42. More particularly, as these processing mechanisms, a brush scrubber 41f for cleaning the semiconductor wafer W by bushing and a high-pressure jet cleaning unit 41g for cleaning the wafer W by high-pressure jet water are parallely disposed on the carrier station 30 side, and two developing units 41e are parallely disposed and two heating units 41b adjacent to these units are stacked on the opposite side of the transfer path of the main arm, all of which serve as process stations.

On the side of the above process mechanisms, an adhesion process unit 41a for hydrophobically treating the semiconductor wafer W before a photoresist is coated on the wafer W is provided through a connection unit 35, and a cooling unit 41c is disposed under the adhesion process unit 41a. Heating unit 41b are disposed to be stacked in two arrays each consisting the two heating units sideways these units 41a and 41c.

Two resist coating apparatuses 41d for coating the photoresist solution on the semiconductor wafer W are parallely disposed on the opposite side of the heating units 41b, the adhesion process unit 41a, and the like to interpose the transfer path of the main arm 42. An exposing unit (not shown) for exposing a predetermined micropattern on the resist film, and the like are provided sideways the resist coating apparatus 41d.

In the resist coating/developing apparatus having the above arrangement, an unprocessed wafer W to be coated is picked up from the wafer carrier 32 by the auxiliary arm 33 of a loading/unloading mechanism, and the wafer W on the auxiliary arm 33 is held and conveyed by the main arm 42 sequentially to the process mechanisms 41a to 41e, and properly processed. The processed wafer W is conveyed by the main arm 42 again, and stored in the wafer carrier 32 by the auxiliary arm 33, thereby completing the processing operation of the wafer W.

The bellows pump 8g having a motor pump arrangement has been described, in which a predetermined amount of the resist solution B in the resist solution tank is supplied to the wafer W by supply solution operation by expansion and contraction of the bellows through the ball screw 8k driven by the stepping motor 8h. However, a diaphragm may be used instead of the bellows. In addition, a linear motor may be used for linearly movement instead of the stepping motor, and a belt drive may be used. Still further, an electronic air pump for electrically controlling an air cylinder may be used.

Since the temperatures of the solvent and the resist solution are controlled by the temperature adjustment mechanism 10, the thickness variation of the resist film can be reduced. According to the conventional drawback, by a change in cooling temperature, the resist film thickness is thin at the central portion of the processing target and is thick at the peripheral portion of the processing target when the cooling temperature is high. However, according to this system that the resist solution is supplied after the solvent is coated, the present inventor confirms in an experiment that the uniform thickness of the resist film can be obtained despite of a change in cooling temperature. In addition, conventionally, the thickness of the resist film is thin at the central portion of the processing target and is thick at the peripheral portion of the processing target when the temperature inside the processing vessel is high, similar to the change in cooling temperature. However, according to this system that the resist solution is supplied after the solvent is coated, the present inventor confirms in an experiment that the uniform thickness of the resist film can be obtained despite of a change in temperature inside the processing vessel.

Figure 9:
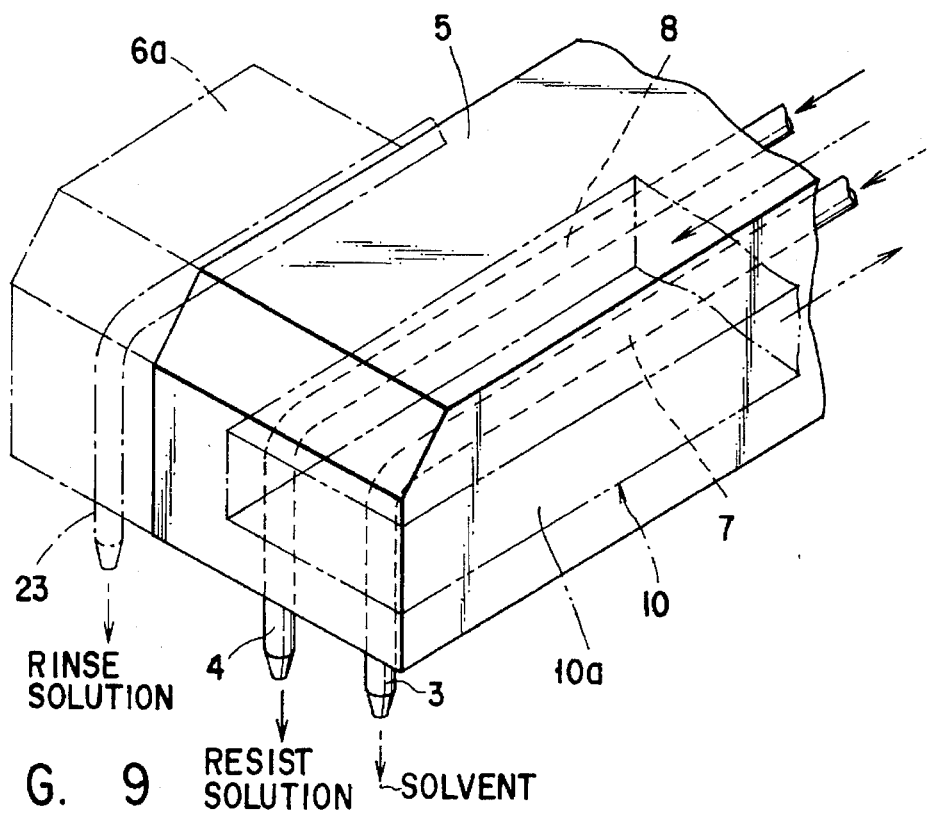
FIGS. 9 and 10 are a perspective view and a sectional view, respectively, showing the modification of a spray head.
Figure 10:
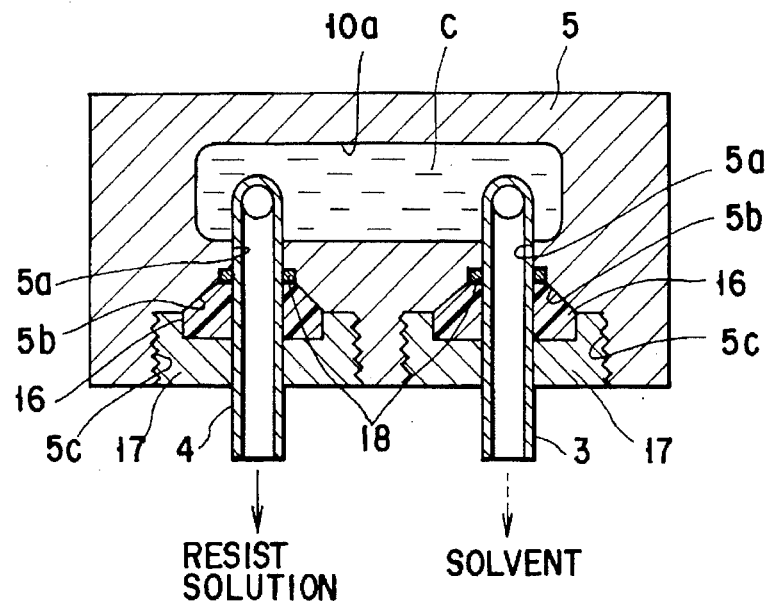

In the above embodiment, the arrangement that the solvent supply nozzle 3 is formed in the spray head 5 integrally with the supply nozzle 4 has been described. The arrangement, however, is not limited to this, and the solvent supply nozzle 3 may be provided integrally with the rinse solution supply nozzle 23 to supply the solvent as shown in FIGS. 9 and 10.

In this example, the common temperature adjustment mechanism 10 is disposed in the supply path of the solvent and the supply path of the resist solution. The spray head 5 and the scanning arm 6a of the scanning mechanism 6 are integrally formed, a temperature adjustment solution supply path 10a is formed in the spray head 5 and the scanning arm 6a, and the solvent supply tube 7 and the resist solution supply tube 8 are disposed in this supply path 10a, so that the same temperature adjustment solution C can adjust the temperatures of the solvent A and the resist solution B. By this arrangement, the structure of the temperature adjustment mechanism 10 can be simplified, and the temperatures of the solvent A and the resist solution B can be kept equal to each other.

Figure 11:
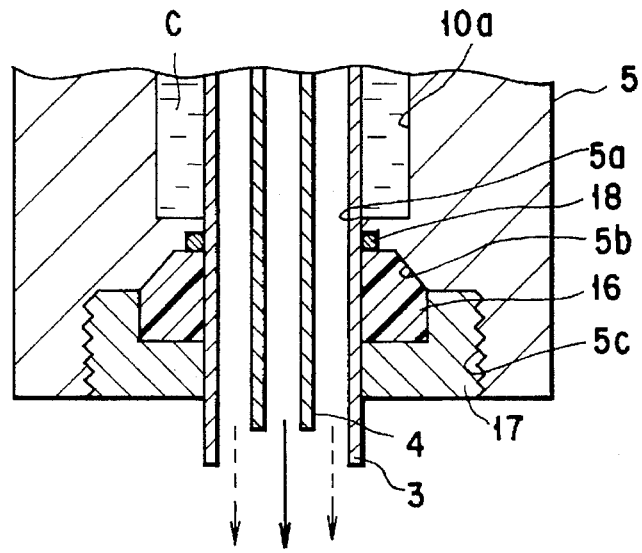
FIGS. 11, 12 and 13 are sectional views respectively showing the different modifications of the nozzle assembly of a spray head.
Figure 12:
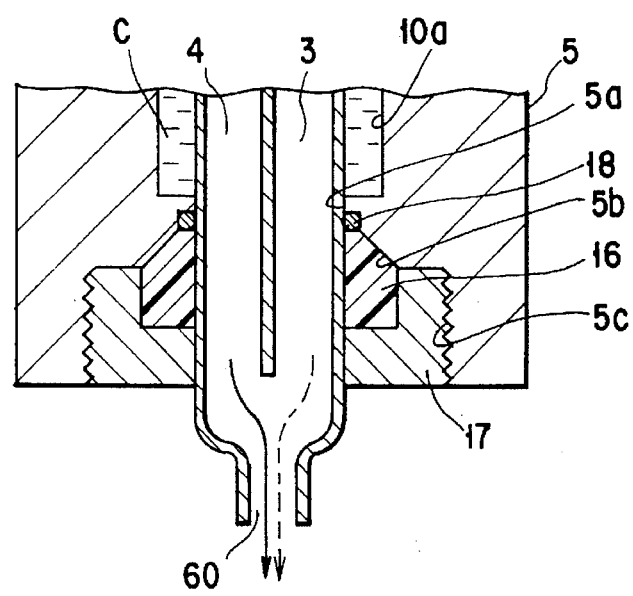
Figure 13:
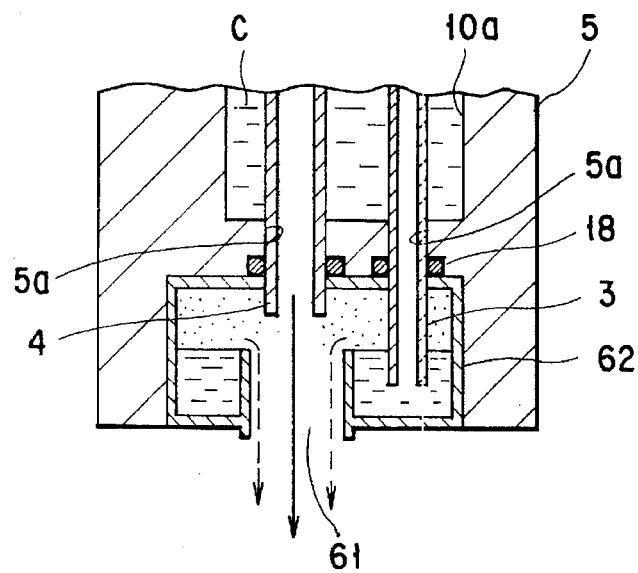

The arrangement and structure of the spray head 5 and the nozzles are not limited to the above example, and the spray head 5 and the nozzles may be disposed, as shown in FIGS. 11 to 13.

In the example shown in FIG. 11, the solvent supply nozzle 3 is disposed coaxially with the resist solution supply nozzle 4 around the outer circumference of the supply nozzle 4. The resist solution supply nozzle 4 and the solvent supply nozzle 3 constitute a double pipe structure, and the distal end of the solvent supply nozzle 3 extends downward to be lower than the distal end of the resist solution supply nozzle 4. As a matter of course, the distal end of the solvent supply nozzle 3 may be at the same level as that of the distal end of the supply nozzle 4, or the former may be shorter. Alternatively, the resist solution supply nozzle 4 may be disposed outside the solvent supply nozzle 3.

As shown in FIG. 12, a mechanism that the resist solution supply nozzle 4 and the solvent supply nozzle 3 are placed side by side, and an outlet port 60 for these nozzles is commonly used may be employed.

As shown in FIG. 13, the distal end of the solvent supply nozzle 3 is inserted into the solvent in an annular solvent storage tank 62 formed inside the spray head 5 and having an outlet port 61 at the center, and the distal end of the resist solution supply nozzle 4 is positioned at the upper portion inside the tank 62 to expose the distal end of the nozzle 4 in a gasified solvent atmosphere. In this manner, since the distal end of the solvent supply nozzle 3 is disposed at the outer circumference of the distal end of the resist solution supply nozzle 4, the resist attached to the resist solution supply nozzle 4 can be cleaned by the solvent, and the resist solution can be prevented from drying, thereby preventing generation of particles by drying of the resist.

Figure 14:
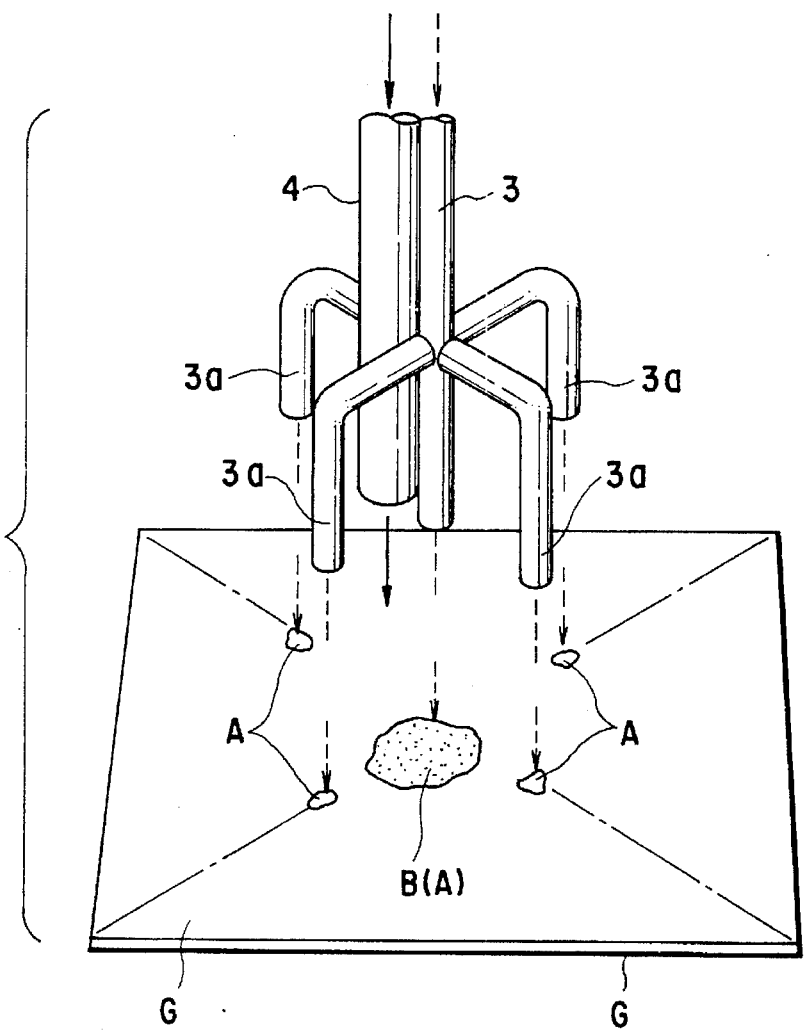
FIG. 14 is a perspective view showing the modification of a nozzle assembly and a glass substrate as a body on which a coating film is to be formed.

A nozzle mechanism shown in FIG. 14 is suitable for a case that a body on which a coating film is to be formed does not have a disk-like shape, but a rectangular shape, such as a glass substrate used for a liquid crystal display apparatus, and a coating film is formed on this substrate. In this example, the solvent supply nozzle 3 is disposed along the outer circumference of the resist solution supply nozzle 4, and the distal end of the nozzle 3 is branched into a plurality (e.g., four) of portions in this example. As a result, the solvent is supplied to the four portions at the same time. Preferably, these branched nozzles 3a are disposed to correspond the four corners of the rectangle similar to a glass substrate G, respectively. The solvent is supplied to the corresponding positions on the diagonal lines with respect to the center of the substrate G at the same time. In this manner, even if the substrate is rectangular, diffusion of the solvent can be made uniform to a certain degree.

Examples of the method of forming a resist film will be described with reference to experiments.

Experiment 1

For example, methylmethoxypropionate (MMP) is used as a solvent A, and a discharge amount is determined in accordance with a degree of unevenness (the upper surface of a wafer or a film formed on the wafer is flat or uneven or has a stepped portion). In general, the discharge amount for an uneven surface is set larger than that for a flat surface. For example, the discharge amount for the uneven surface is 0.7 cc, and the discharge amount for the flat surface is 0.9 cc.

In this example, 0.7 cc of the solvent were dropped on the central portion of the surface of an 8" wafer W while rotating the wafer W at a rotational speed of 1,000 rpm, thereby diffusing the solvent along the wafer W in the circumferential direction. In this rotating state, 0.9 cc of a resist solution were dropped on the central portion of the wafer W before the solvent A on the wafer W was dried, i.e., 2 sec after dropping the solvent A. The resist solution B was dropped while the dropping (discharge) time and the rotational speeds of the wafer W during and after dropping were properly changed. Results are shown in FIG. 15. The ordinate in FIG. 15 represents a difference (thickness variation range) between a resist film portion having a maximum thickness and a resist film portion having a minimum thickness, and the abscissa represents the rotational speed of the wafer W.

As can be apparent from FIG. 15, the thickness variations became minimum within the respective dropping times to be as small as $50^2$ or less when the discharge time of a resist solution B was 2.5 sec and the rotational speed of the wafer W was 1,000 rpm, the discharge time of the resist solution B was 2.0 sec and the rotational speed of the wafer W was 3,500 rpm, the discharge time of the resist solution B was 1.0 sec and the rotational speed of the wafer W was 4,500 rpm, and the discharge time of the resist solution B was 0.7 sec and the rotational speed of the wafer W was 5,000 rpm. In this case, the resist films formed on the wafers were uniform. Judging from this experiment, it is found that a film having a uniform thickness can be formed by properly selecting the rotational speed of the wafer W in accordance with the discharge time of the resist solution. The relationship between the discharge time, the rotational speed, and the discharge flow rate is shown in FIG. 16.

In Experiment 1, the resist solution B had the discharge amount of 0.9 cc. However, it is found that the same effect as described above can be obtained when the discharge amount of the resist solution B is set to 0.5 to 2.0 cc for a flat surface and 1.0 to 3.0 cc for a stepped surface.

Experiment 2

For example, ethyl cellosolve acetate (ECA) or methylmethoxypropionate (MMP) is used as a solvent A, and a discharge amount is determined in accordance with a degree of unevenness. In using ECA, 0.2 cc of the solvent are dropped on a flat surface, and 0.3 cc of the solvent are dropped on an uneven surface. In using MMP, 0.4 cc of the solvent are dropped on a flat surface, and 0.5 cc of the solvent are dropped on an uneven surface.

In this example, the solvent A was dropped on the central portion of the surface of a 6" flat wafer W while rotating the wafer W at a rotational speed of 1,000 rpm, thereby diffusing the solvent along the wafer W in the peripheral direction. In this rotating state, 0.2 to 0.3 cc of the resist solution B were dropped on the central portion of the wafer W before the solvent A on the wafer W was dried, i.e., 2 sec after dropping the solvent A. The resist solution B was dropped while the dropping (discharge) time and the rotational speeds of the wafer W during and after dropping were properly changed. Results are shown in FIG. 17.

Figure 17:
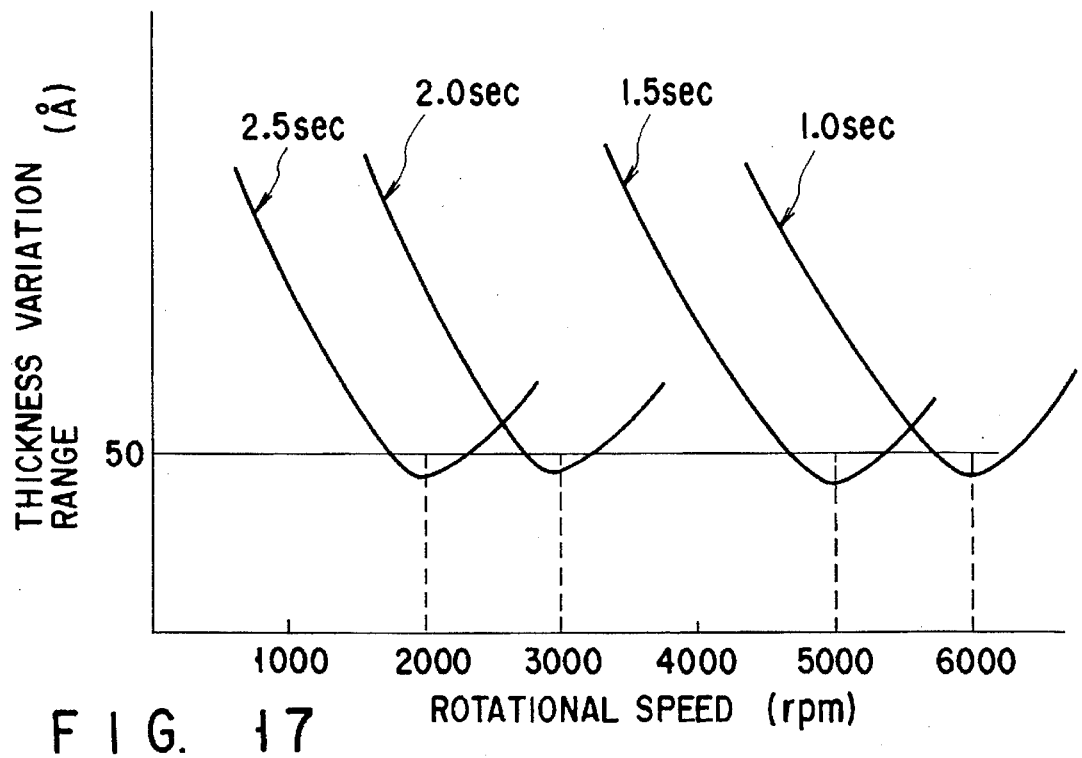

As can be apparent from FIG. 17, the thickness variations became minimum within the respective dropping times to be as small as 50 Å or less when the discharge time of a resist solution B was 2.5 sec and the rotational speed of the wafer W was 2,000 rpm, the discharge time of the resist solution B was 2.0 sec and the rotational speed of the wafer W was 3,000 rpm, the discharge time of the resist solution B was 1.5 sec and the rotational speed of the wafer W was 5,000 rpm, and the discharge time of the resist solution B was 1.0 sec and the rotational speed of the wafer w was 6,000 rpm. Judging from this experiment, it is found that a film having a uniform thickness can be formed by properly selecting the rotational speed of the wafer W in accordance with the discharge time of the resist solution.

Judging from both the experiments, the solvent A is dropped on the surface of the wafer W, the wafer W is rotated at a predetermined rotational speed (e.g., 1,000 rpm), and the solvent A is diffused over the entire upper surface of the wafer W. The resist solution B is discharged on the wafer W in a predetermined amount (0.6 to 0.9 cc for an 8" wafer, and 0.2 to 0.3 for a 6" wafer) for a predetermined period of time (0.7 to 2.5 sec for an 8" wafer, and 1.0 to 2.5 sec for a 6" wafer) in accordance with the size of the wafer before the solvent A is dried. In addition, the wafer W is rotated at a predetermined rotational speed (5,000 to 1,000 rpm for an 8" wafer, and 6,000 to 2,000 rpm for a 6" wafer). Therefore, the resist film having a uniform thickness can be formed on the surface of the wafer. In addition, an amount of resist solution used can be decreased. This is estimated that since the resist solution B is diffused to follow drying of the solvent A dropped in advance and diffused from the central portion of the wafer W to the peripheral edge portion (i.e., the resist solution B reaches a portion immediately before the solvent film gradually drying from the central portion to the peripheral edge portion dries), the solvent A and the resist solution B contact in a uniform ratio with good wettability.

Other coating apparatuses will be described with reference to FIGS. 18 to 20. The same reference numerals as in the apparatus in FIGS. 1 and 2 denote substantially the same parts in the coating apparatuses, and a detailed description thereof will be omitted.

The apparatus shown in FIG. 18 is constituted such that the resist coating method is performed in a solvent A atmosphere. For this reason, a process vessel 1 has a sealed structure, and a saturation atmosphere of the solvent A is constituted inside the sealed process vessel 1.

The main portion of the process vessel 1 is constituted by an outer vessel 30, an inner vessel 31, and a cover member 32. The upper surrounding portion of the outer vessel 30 surrounds a wafer W and can vertically move. The inner vessel 31 constitutes the bottom portion of the process vessel 1. The cover member 32 covering the opening of the upper portion of the outer vessel 30.

The outer vessel 30 comprises a cylindrical outer vessel main body 30a surrounding the wafer W on a spin chuck 2, and a cylindrical movable wall 30b mounted to the outer vessel main body 30a to be vertically movable. The movable wall 30b can be vertically moved by a vertically moving arm (not shown) with respect to the outer vessel main body 30a.

A cylindrical wall 31b extends on the upper surface of a bottom portion 31a in the inner vessel 31. The bottom portion 31a is preferably inclined outward so as to exhaust a waste solution. A doughnut-like rotary member 31e is disposed to be rotatable in a horizontal plane at the upper end of the cylindrical wall 31b through a bearing 31d, and connected to the spin chuck 2 to be rotated. An annular solvent reservoir channel 31f whose upper surface is open is formed at the peripheral edge portion of the rotary member 31e, and the solvent A is stored in the solvent reservoir channel 31f. A cylindrical vertical wall 31g extends downward under the solvent reservoir channel 31f of the rotary member 31e, and a plurality of communication ports 31h communicating with an exhaust port 1e and a liquid discharge port if at the lower portion are formed at proper positions of the vertical wall 31g.

The dome-like cover member 32 comprises a rotating shaft 32c suspended by a suspending arm 32a through a bearing 32b to be rotatable in a horizontal plane. The cover member 32 air-tightly contacts the rotary member 31e through a seal member 32d, e.g., an O-ring, provided to the inner circumferential surface of the opening at the lower portion. In this contact state, an enclosed space 35 is defined, and the rotational force from the rotary member 31e is transmitted to the cover member 32. The cover member 32 is vertically moved by the suspending arm 32a which is vertically moved by a vertically moving mechanism (not shown). A solvent supply nozzle 3 and a resist solution supply nozzle 4 are provided to be rotatable together with the cover member 32. The nozzles 3 and 4 respectively connected to a solvent supply path 33 and a resist supply path 34 which extend through the rotating shaft 32c and are rotatably connected to a solvent supply tube and a resist solution supply tube are mounted in the cover member 32 to be rotatable therewith.

In the coating apparatus having the above arrangement, when the solvent A is stored in the solvent reservoir channel 31f, and the cover member 32 is closed, the solvent A is evaporated and the saturation atmosphere of the solvent A can be realized inside the enclosed space 35 or the process chamber. In this atmosphere, a resist film is formed on the wafer according to the above method. More specifically, the solvent A is dropped on the wafer W to form a film of the solvent A on the wafer W while the enclosed space 35 is filled with the saturated solvent A. Before the solvent A is dried, a resist solution B is supplied to the wafer W at a predetermined rotational speed of the wafer W for a predetermined period of time in a predetermined amount, so as to form the resist film on the surface of the wafer.

Since the coating process can be performed in the solvent atmosphere using this apparatus, drying of the solvent after coating can be suppressed, and uniformity of the film thickness can be further achieved.

In the above description, the solvent reservoir channel 31f is provided on the rotary member 31e of the inner vessel 31, and the solvent A is stored in this channel 31f, so that the saturation atmosphere of the solvent is realized inside the enclosed space 35. However, the structure is not limited to this. For example, a larger amount of the solvent A is discharged from the solvent supply nozzle 3 to realize the solvent atmosphere inside the enclosed space 35, or the mist of the solvent in saturation state is introduced to the enclosed space 35 using, e.g., an inlet pipe, to realize the solvent atmosphere inside the enclosed space 35.

The apparatus shown in FIG. 19 is constituted such that the resist coating method is performed in a reduced pressure atmosphere. For this reason, the process vessel 1 has a sealed structure, and a pressure in the process chamber is reduced to a predetermined value to perform resist coating in this reduced pressure atmosphere.

The apparatus shown in FIG. 19 is substantially the same apparatus as that shown in FIG. 18 except that the solvent reservoir channel 31f is not provided. In this apparatus, a pressure in the enclosed space 35 can be reduced to a predetermined value, e.g., 90 mm H$_2$O, by a vacuum pump 36 connected to an exhaust pipe 21 connected to the exhaust port 1e through the communication port 31h formed on the rotary member 31e.

The coating method in the apparatus shown in FIG. 19 is basically the same as the above-mentioned method except that the atmosphere differs from the above solvent atmosphere, and a detailed description thereof will be omitted.

In the coating process in the reduced pressure atmosphere, since scattering particles can be induced toward the communication port 31h, the resist solution B dropped on the wafer W is prevented from scattering and attaching again to the inner surface of the process vessel, thereby preventing contamination of the wafer W by particles and a decrease in yield. In addition to prevention of a resist particle from attaching to the inner surface of the process vessel, according to the present invention, since a small amount of resist solution is used, maintenance and inspection for the vessel are not time-consuming.

A coating apparatus in which a plurality (e.g., three in this embodiment) of resist solution supply nozzles 3 are provided to a spray head 5 will be described with reference to FIGS. 20 and 21.

As shown in FIG. 21, four nozzles are linearly disposed at the distal end portion of the elongated spray head 5 whose proximal end portion is pivotally mounted on a housing 111 to be rotatable about a scanning mechanism 6 in a horizontal plane in a direction indicated by an arrow. All the four nozzles are moved together with the movement of the spray head 5. The first nozzle 3 is for supplying a solvent, and other three nozzles 4a, 4b, and 4c are for supplying different kinds of resist solutions under an AND/OR condition. In this embodiment, the respective resist solution supply nozzles 4a, 4b, and 4c are connected through resist solution supply mechanisms to corresponding tanks in which the different kinds of resist solutions are contained (one tank 8b and one solution supply mechanism are represented in FIG. 20).

In this apparatus, different kinds of coating films can be formed without exchanging the spray head 5.

In the apparatus according to the embodiment shown in FIGS. 20 and 21, the resist solution supply nozzles are linearly disposed. However, the arrangement is not limited to this. For example, the nozzles may be disposed on the circumference using the solvent supply nozzle as a center. In addition, the solvent supply nozzle 3 and the resist solution supply nozzles need not be provided integrally in the spray head 5. For example, as indicated by a dashed line in FIG. 22, the solvent supply nozzle 3 may extend to the right or left of the spray head 5 (in the example shown in FIG. 22, four resist solution supply nozzles 4a to 4e are used).

Furthermore, as indicated by the dashed line in FIG. 22, a moving arm 23a supporting a rinse solution supply nozzle 23 may be further extended above the center of a wafer W on a spin chuck 2, and the solvent supply nozzle 3 may be provided to the distal end of this arm. In this case, a moving mechanism 24 may be constituted to vertically move the arm 23a, and the height of the rinse supply position by the rinse solution supply nozzle 23 and the height of the solvent supply position by the supply nozzle 3 may be independently changed. The solvent supply nozzle 3 may be disposed toward the center of the wafer W without extending the arm 23a above the center of the wafer W. Instead, as indicated by a chain line in FIG. 22, the rinse mechanism may be provided to the opposite side (upper left side in FIG. 22) of the wafer W. Alternatively, as indicated by a chain double-dashed line in FIG. 22, the rinse mechanism may be provided to the wafer W side to pivot the arm 23a using the moving mechanism 24 as a center or parallely move the arm 23a as indicated by an arrow 107, thereby moving the rinse nozzle 23 to the wafer W.

The solvent supply nozzle may be fixed to the housing 111 of the coating apparatus using mounting member (not shown). In this case, the solvent supply nozzle is mounted at a position without interfering to loading/unloading the wafer W, and the solvent is obliquely sprayed toward the rotational center of the wafer W, preferably.

The spray form of the solvent by the solvent supply nozzle may take one flow, or a lot of flows, or may be not spreaded. As has been described in the above embodiment, a plurality of solvent supply nozzles may be provided. In this case, for example, outlet diameters are differed from each other to control discharge states from the respective nozzles corresponding to discharge flow rates or changes in discharge flow rate. Instead, in order to supply different solvents from the respective nozzles, the nozzles may be connected to corresponding tanks, and the kinds of solvents or a discharge sequence is selected, thereby obtaining optimal coating conditions.

In still another coating apparatus shown in FIG. 23, four spray heads 5a to 5d are disposed in an array above a housing 111. Each of supply nozzles 3a to 3d for a solvent A and each of supply nozzles 4a to 4d for a resist solution B are provided integrally to a corresponding one of the spray heads. Each of the spray heads is supported by one end of a corresponding one of horizontally extending arm members 200a to 200d bent in a crank-shaped manner. The other end of each of the arm members 200a to 200d is connected to a corresponding one of mounting portions 201a to 201d on which support pins 19a to 19d extend upward. These mounting portions are provided with bores 202a to 202d formed in the upper surfaces and supported in an array on a table 206 to be moved at one time. The table 206 can be moved in the Y direction by a moving mechanism 207, and the four mounting portions 201a to 201d can be also moved with this movement at the same time. A scanning arm 6a is disposed near the table 206, of which holding portion 210 is extended so that its lower surface may oppose the table 206. Thus, a holding hole 6b and a projection 212 having the substantially same diameter as the inner diameter of the bores 202a to 202d, which as formed on the lower surface of the holding portion 210 may be faced with the support pin and the bore of any one of the mounting portions 201a to 201d. The holding hole 6b is connected to a vacuum means (not shown) so that is constitutes a suction port for sucking the support pin for supporting the mounting portion. When the holding portion 210 comes down from the upper position onto the selected one of the mounting portions 201a and 201d, it supports the mounting portion by means of vacuum suction. The scanning arm 6a is supported by a drive unit 216 to be movable in the X and vertical directions with respect to the housing 111.

The apparatus having the above arrangement will be described below.

The table 206 is moved in the Y direction to position the selected mounting portion pin (assuming the pin 201b in this case) to a position opposing the holding portion 210. Then, the scanning arm 6a is moved in the X direction by the drive unit 216, the holding portion 210 is moved above the mounting portion 201b to cause it to come down so that the holding hole 6b is engaged with the support pin 19b and the mounting portion 201b is supported by the holding portion 210. In this state, the scanning arm 6a is moved upward by the drive unit 216 to lift the mounting portion 201b from the table 206. In addition, the spray head 5b is moved in the X direction to position the solvent supply nozzle 3b above the central portion of the wafer W. Thereafter, a resist film is formed on the wafer W according to the same coating method as in the above embodiments.

Each of the four solvent supply nozzles 3a to 3d is connected to a common tank or a corresponding one of various tanks, and a predetermined amount of solvent can be sprayed from the nozzles in the same manner as in the above embodiments. Similarly, each of the four resist solution supply nozzles 4a to 4d is connected to a corresponding one of tanks which contain different kinds of coating solutions, and a predetermined amount of coating solution can be sprayed from the nozzle for a predetermined period of time.

In the coating apparatus having the above arrangement, since an arbitrary one of the plurality of the spray heads can be selectively used, resist films under different conditions can be easily formed at high speed. Since the connection portion between the scanning arm 6a and the mounting portion 201b does not pass above the wafer W during movement, particles which tend to be produced at the connection portion will not fall on the wafer W.

FIG. 24 is an apparatus shown in FIG. 23, and shows another arrangement relationship of a rinse mechanism, as in FIG. 22. The arrangement relationship is the same as in FIG. 22, and a description thereof will be omitted. However, its content will be easily understood by a person skilled in the art.

In a modification shown in FIG. 25, two sets of spray heads 5 are mounted on a scanning arm 6a provided to a housing 111 to be movable in the X direction. A solvent supply nozzle 3 is mounted on the first spray head 5 fixed on the left side of the arm 6a. Each of resist solution supply nozzles 4 is mounted on a corresponding one of the four spray heads 5 provided to the other side of the arm 6a through a mounting plate. In this example, in order to position a predetermined resist solution supply nozzle above the central portion of a semiconductor wafer W and use the nozzle, the arm 6a is constituted to be movable also in the Y direction by a drive mechanism 6, or the mounting plate is constituted to be movable in the Y direction with respect to the arm 6a by a drive mechanism (not shown).

In the example shown in FIG. 26, an elongated spray head 5 for supporting a plurality (e.g., three in this case) of solvent supply nozzles 3 in an array is used. In this case, the elongated spray head 5 is mounted on an arm 6a to extend in a direction perpendicular to the arm 6a (X direction), as indicated by a solid line, or in a direction parallel to the arm 6a (Y direction), as indicated by a dashed line. In this example, the elongated spray head 5 supporting the nozzle 3 is positioned above a wafer W, and the arm 6a is positioned to match with the diameter of the wafer W, so that the solvent can be supplied to the wafer W from four portions along the radial direction at the same time.

A resist solution, an ARC (Anti Reflection Coating) solution, or the like may be used as the above coating solution. As the resist solution a mixture of phenolnovolac resin and naphthoquinone diazide ester may be used.

As the solvents, in addition to methyl-3-methoxypropionate (MMP, boiling point: 145° C., viscosity: 1.1 cps), ethyl lactate (EL, boiling point: 154° C., viscosity: 2.6 cps), ethyl-3-ethoxypropionate (EEP, boiling point: 170° C., viscosity: 1.3 cps), ethyl pyruvate (EP, boiling point: 144° C., viscosity: 1.2 cps), and proplyleneglycol monomethylether acetate (PGMEA, boiling point: 146° C., viscosity: 1.3 cps), 2-heptanone (boiling point: 152, viscosity: 1.1), cyclohexane (used for an ARC solution), all of which are well-known in this art, can be used.

Each of the above embodiments has exemplified the apparatus for forming a coating film according to the present invention applied to the resist coating apparatus for a semiconductor wafer. However, this apparatus can be applied to a coating apparatus for a processing target, e.g., an LCD substrate, a CD, and the like, in addition to a resist and can also be applied to, e.g., a polymide-based coating solution (PIQ), a coating solution (SCG) containing a glass agent, and the like, as a matter of course.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of forming a coated film, comprising the steps of:
    applying a solvent of a coating solution on one surface of a substrate which is rotating;
    rotating said substrate having solvent applied thereto at a first rotational speed to diffuse said solvent over the entire area of said one surface; and
    applying a coating solution onto the substantially center portion of said substrate while rotating said substrate at a second rotational speed, which results in spreading of coating solution over the entire area of said one surface as evenly as possible to form a coated film of uniform thickness.

2. The method according to claim 1, wherein the amount of coating solution is set in accordance with the rotational speed of said substrate in view of the rate of drying of the solvent of the solution.

3. The method according to claim 2, wherein the amount of the coating solution and the rotational speed of said substrate are set so that the thickness variation of the coated film falls within a range of not more than 50 Å.

4. The method according to claim 1, wherein the first rotational speed differs from the second rotational speed.

5. The method according to claim 4, wherein the first rotational speed is a rotational speed sufficient to scatter the solvent from said substrate, followed by further rotation of the substrate at a rotational speed which is less than the former rotational speed.

6. The method according to claim 1, wherein the first rotational speed is substantially equal to the second rotational speed.

7. A method of forming a coated film, comprising the steps of:
    applying a solvent of a coating solution on one surface of a substrate which is rotating, from a nozzle means;
    rotating said substrate having solvent applied thereto to diffuse the solvent over the entire area of said one surface; and
    applying an amount of coating solution onto the substantially center portion of said substrate for a predetermined period of time while, from a nozzle means, which results in spreading of the coating solution to the peripheral portion of said substrate in order to form the coated film of a uniform thickness.

8. The method according to claim 7, wherein the diffusing speed of the coating solution to the peripheral portion of said substrate is substantially equal to the drying speed of the solvent.

9. A method of forming a resist film, comprising:
a step of applying a solvent of a resist solution on one surface of a semiconductor wafer which is rotating;
a step of rotating said semiconductor wafer having solvent applied thereto to diffuse the solvent over the entire area of said one surface;
the resist film forming step of applying an amount of resist solution from a nozzle having a predetermined inner diameter on the substantially center portion of said semiconductor wafer for a period of time, while rotating said semiconductor wafer at a rotational speed of 1,000 to 6,000 rpm, the resist solution is diffused over the entire area of said one surface of said semiconductor wafer to form the resist film of uniform thickness.

10. The method according to claim 9, wherein the rotational speed of said semiconductor wafer in the resist forming step is said to be lower as the diameter of the semiconductor wafer, selected for coating, becomes larger.

11. The method according to claim 9, wherein the rotational speed in the resist film forming step is 3,000 to 6,000 rpm for a 6" wafer, 2,000 to 4,000 rpm for an 8" wafer, and 1,000 to 6,000 rpm for a 12" wafer.

12. The method according to claim 9, wherein the inner diameter of the nozzle is 0.1 to 2.0 mm for a 6" semiconductor wafer, 0.5 to 2.0 mm for an 8" semiconductor wafer, and 0.8 to 3.5 mm for a 12" semiconductor wafer.

13. The method according to claim 9, wherein the time over which resist solution is applied in the resist film forming step is set to be less for an uneven surface of said semiconductor wafer in comparison to a semiconductor wafer having a flat surface.

14. The method according to claim 13, wherein the supplying time in the resist film forming step is 4 ±2 sec for a flat surface of a 6" semiconductor wafer, 3 ±2 sec for an uneven surface of a 6" semiconductor wafer, 6 ±2 sec for a flat surface of an 8" semiconductor wafer, 4 ±2 sec for an uneven surface of an 8" semiconductor wafer, 9 ±1 sec for a flat surface of a 12" semiconductor wafer, and 7 ±1 sec for an uneven surface of a 12" semiconductor wafer.

15. The method according to claim 14, wherein the amount of the resist solution applied in the resist film forming step is 0.2 to 1.0 cc for a flat surface of a 6" semiconductor wafer, 0.5 to 2.0 cc for an uneven surface of a 6" semiconductor wafer, 0.5 to 2.0 cc for a flat surface of an 8" semiconductor wafer, 1.0 to 3.0 cc for an uneven surface of an 8" semiconductor wafer, 1.0 to 3.0 cc for a flat surface of a 12" semiconductor wafer, and 1.5 to 5.0 cc for an uneven surface of a 12" semiconductor wafer.

16. The method according to claim 9, wherein the amount of resist solution applied in the resist film forming step is set to be greater for said semiconductor wafer having an uneven surface in comparison to a semiconductor wafer having a flat surface.

17. The method according the claim 9, wherein the resist solution is a mixture of phenol-novolac resin and naphthoquinone diazide ester.

18. A method of forming a coated film, comprising the steps of:
applying a solvent of a coating solution on one surface of a substrate which is rotating;
rotating said substrate having solvent applied thereto to diffuse the solvent over the entire area of said one surface; and
sequentially applying the coating solution from a nozzle onto the substantially central portion of said substrate over an initial period when the discharge flow rate of the coating solution gradually increases, an intermediate period when the discharge flow rate is substantially constant, and the last period when the discharge flow rate gradually decreases while rotating said substrate, thereby diffusing the coating solution over the entire area of said one surface of said substrate to form the coated film, wherein the last period is controlled.

19. A method of forming a coated film, comprising the steps of:
applying a solvent of a coating solution on one surface of a substrate which is rotating;
rotating said substrate having solvent applied thereto to diffuse the solvent over the entire area of said one surface; and
sequentially applying the coating solution from a nozzle onto the substantially central portion of said substrate over an initial period when the discharge flow rate of the coating solution gradually increases, an intermediate period when the discharge flow rate is substantially constant, and the last period when the discharge flow rate gradually decreases while rotating said substrate, thereby diffusing the coating solution over the entire area of said one surface of said substrate to form the coated film, wherein at least the discharge time of the coating solution and the deceleration of the rate of rotation of the last period is controlled.

20. A method of forming a coated film, comprising the steps of:
applying a solvent of a coating solution on one surface of a substrate which is rotating;
rotating said substrate having solvent applied thereto to diffuse the solvent over the entire area of said one surface; and
sequentially applying the coating solution from a nozzle onto the substantially central portion of said substrate over an initial period when the discharge flow rate of the coating solution gradually increases, an intermediate period when the discharge flow rate is substantially constant, and the last period when the discharge flow rate gradually decreases while rotating said substrate, thereby diffusing the coating solution over the entire area of said one surface of said substrate to form the coated film, wherein the respective discharge times of the initial period, an intermediate period, and the last period are independently controlled.

21. A method of forming a coated film, comprising the steps of:
applying a solvent of a coating solution on one surface of a substrate which is rotating;
rotating said substrate having solvent applied thereto to diffuse the solvent over the entire area of said one surface;
controlling a pump to supply the coating solution to a nozzle through a supply path by said pump over an initial period when the discharge flow rate of the coating solution gradually increases, an intermediate period when the discharge flow rate is substantially constant, and the last period when the discharge flow rate gradually decreases so as to supply the coating solution onto the substantially central portion of said rotated substrate, thereby diffusing the coating solution over the entire area of said one surface of said substrate to form the coated film; and closing said supply path 0.1 to 1.2 sec after said pump is stopped;

wherein at least one of the discharge time of the coating solution and the deceleration of the rate of rotation of the last period is controlled.

22. A method of forming a coated film, comprising the steps of:

applying a solvent of a coating solution on one surface of a substrate which is rotating;

rotating said substrate having solvent applied thereto at a first rotational speed to diffuse said solvent over the entire area of said one surface; and applying a coating solution onto the substantially center portion of said substrate while rotating said substrate at a second rotational speed, the first and second rotational speeds being substantially equal, which results in spreading of coating solution over the entire area of said one surface as evenly as possible to form a coated film of uniform thickness.

23. A method of forming a coating film, comprising the steps of:

supplying a solvent of a coating solution on the center of one surface of a substrate which is being rotated or stopped from a first nozzle positioned above the center of the substrate;

moving the first nozzle to the outside of the center of the substrate therefrom;

rotating the substrate having solvent applied thereto to diffuse the solvent over the entire area of said one surface;

moving a second nozzle above the center of the substrate from the outside thereof; and supplying a coating solution on the center of said one surface of the substrate while rotating the substrate, thereby diffusing the coating solution over the entire area of said one surface to form a coated film.

* * * * *